US012588209B2

(12) United States Patent     (10) Patent No.:   US 12,588,209 B2

Mukae et al.     (45) Date of Patent:    Mar. 24, 2026

(54) THREE-DIMENSIONAL MEMORY DEVICE CONTAINING COMPOSITE WORD LINES INCLUDING A RESPECTIVE FLUORINE-FREE CAPPING SUBLAYER AND METHODS OF FORMING THE SAME

(71) Applicant: SANDISK TECHNOLOGIES LLC, Addison, TX (US)

(72) Inventors: Yusuke Mukae, Nagoya (JP); Tatsuya Hinoue, Yokkaichi (JP); Raghuveer S. Makala, Campbell, CA (US); Shungo Asaeda, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 371 days.

(21) Appl. No.: 18/360,474

(22) Filed: Jul. 27, 2023

(65) Prior Publication Data

US 2024/0306386 A1     Sep. 12, 2024

Related U.S. Application Data

(60) Provisional application No. 63/488,818, filed on Mar. 7, 2023.

(51) Int. Cl.
    H10B 43/27     (2023.01)
    H10B 41/27     (2023.01)
    (Continued)

(52) U.S. Cl.
    CPC ............. H10B 43/27 (2023.02); H10B 41/27 (2023.02); H10B 41/35 (2023.02); H10B 43/35 (2023.02)

(58) Field of Classification Search
    CPC ........ H10B 41/27; H10B 41/35; H10B 43/27; H10B 43/35
    See application file for complete search history.

(56) References Cited

U.S. PATENT DOCUMENTS 9,397,046 B1   7/2016   Sharangpani et al.
9,748,174 B1   8/2017   Amano
           (Continued)

OTHER PUBLICATIONS

IPRP—Notification Concerning Transmittal of International Preliminary Report on Patentability and Written Opinion of the International Searching Authority for International Patent Application No. PCT/US2023/086532, mailed Sep. 18, 2025, 6 pages.
           (Continued)

*Primary Examiner* — John A Bodnar
(74) *Attorney, Agent, or Firm* — THE MARBURY LAW GROUP PLLC

(57) ABSTRACT

A method of forming a memory device includes forming an alternating stack of insulating layers and sacrificial material layers over a substrate, forming memory openings through the alternating stack, forming memory opening fill structures in the memory openings including respective vertical stack of memory elements and a respective vertical semiconductor channel, forming a lateral isolation trench through the alternating stack, forming lateral recesses by removing the sacrificial material layers selective to the insulating layers and the memory opening fill structures, depositing a first tungsten layer in the lateral recesses using a first tungsten deposition process in which a fluorine-containing tungsten precursor gas is used as a reactant, and depositing a second tungsten layer on the first tungsten layer in the lateral recesses using a second tungsten deposition process in which a fluorine-free tungsten precursor gas is used as a reactant.

10 Claims, 28 Drawing Sheets

(51) Int. Cl.
| | |
|---|---|
| *H10B 41/35* | (2023.01) |
| *H10B 43/35* | (2023.01) |

(56) References Cited

U.S. PATENT DOCUMENTS

| | | | |
|---|---|---|---|
| 9,793,139 | B2 | 10/2017 | Sharangpani et al. |
| 10,229,931 | B1 * | 3/2019 | Hinoue ................. H10B 41/41 |
| 10,290,652 | B1 | 5/2019 | Sharangpani et al. |
| 10,361,213 | B2 | 7/2019 | Sharangpani et al. |
| 10,529,620 | B2 | 1/2020 | Sharangpani et al. |
| 10,608,010 | B2 | 3/2020 | Terasawa et al. |
| 10,615,123 | B2 | 4/2020 | Hinoue et al. |
| 10,741,572 | B2 | 8/2020 | Sharangpani et al. |
| 10,818,545 | B2 | 10/2020 | Shimabukuro et al. |
| 11,217,532 | B2 | 1/2022 | Sharangpani et al. |
| 11,377,733 | B2 | 7/2022 | Zhou et al. |
| 11,631,695 | B2 | 4/2023 | Sharangpani et al. |
| 2014/0120723 | A1 * | 5/2014 | Fu ..................... H01L 21/32051 |
| | | | 438/680 |
| 2016/0300848 | A1 | 10/2016 | Pachamuthu et al. |
| 2017/0125538 | A1 | 5/2017 | Sharangpani et al. |
| 2017/0263621 | A1 | 9/2017 | Wakatsuki et al. |
| 2017/0352669 | A1 | 12/2017 | Sharangpani et al. |
| 2017/0373079 | A1 | 12/2017 | Sharangpani et al. |
| 2018/0090373 | A1 | 3/2018 | Sharangpani et al. |
| 2019/0148397 | A1 * | 5/2019 | Lee ........................ H10B 43/35 |
| | | | 438/791 |
| 2019/0280001 | A1 | 9/2019 | Terasawa et al. |
| 2019/0287916 | A1 | 9/2019 | Sharangpani et al. |
| 2019/0287982 | A1 | 9/2019 | Hinoue et al. |
| 2020/0006131 | A1 | 1/2020 | Shimabukuro et al. |
| 2022/0077185 | A1 | 3/2022 | Ide et al. |
| 2022/0352201 | A1 | 11/2022 | Hinoue et al. |

OTHER PUBLICATIONS

Endoh et al., "Novel Ultra High-Density Memory with a Stacked-Surrounding Gate Transistor (S-SGT) Structured Cell," IEDM Proc. (2001) 33-36.

U.S. Appl. No. 17/573,429, filed Jan. 11, 2022, SanDisk Technologies LLC.

U.S. Appl. No. 17/573,452, filed Jan. 11, 2022, SanDisk Technologies LLC.

U.S. Appl. No. 17/573,466, filed Jan. 11, 2022, SanDisk Technologies LLC.

U.S. Appl. No. 17/806,406, filed Jun. 10, 2022, SanDisk Technologies LLC.

U.S. Appl. No. 17/806,415, filed Jun. 10, 2022, SanDisk Technologies LLC.

U.S. Appl. No. 18/356,896, filed Jul. 21, 2023, SanDisk Technologies LLC.

U.S. Appl. No. 18/356,919, filed Jul. 21, 2023, SanDisk Technologies LLC.

* cited by examiner

THREE-DIMENSIONAL MEMORY DEVICE CONTAINING COMPOSITE WORD LINES INCLUDING A RESPECTIVE FLUORINE-FREE CAPPING SUBLAYER AND METHODS OF FORMING THE SAME

FIELD

The present disclosure relates generally to the field of semiconductor devices, and particularly to a three-dimensional memory device including composite word lines including a respective fluorine-free capping sublayer and methods of forming the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a memory device includes forming an alternating stack of insulating layers and sacrificial material layers over a substrate, forming memory openings through the alternating stack, forming memory opening fill structures in the memory openings including respective vertical stack of memory elements and a respective vertical semiconductor channel, forming a lateral isolation trench through the alternating stack, forming lateral recesses by removing the sacrificial material layers selective to the insulating layers and the memory opening fill structures, depositing a first tungsten layer in the lateral recesses using a first tungsten deposition process in which a fluorine-containing tungsten precursor gas is used as a reactant, and depositing a second tungsten layer on the first tungsten layer in the lateral recesses using a second tungsten deposition process in which a fluorine-free tungsten precursor gas is used as a reactant.

According to another aspect of the present disclosure, a memory device comprises an alternating stack of insulating layers and electrically conductive layers, wherein each of the electrically conductive layers comprises an outer first tungsten layer containing fluorine at a first average fluorine atomic concentration, and an inner second tungsten layer embedded in the first tungsten layer and containing fluorine at a second average fluorine atomic concentration that is less than 50% of the first average fluorine atomic concentration; memory openings vertically extending through the alternating stack; and memory opening fill structures located in the memory openings and comprising a respective vertical stack of memory elements and a respective vertical semiconductor channel.

DETAILED DESCRIPTION

Figure 1:
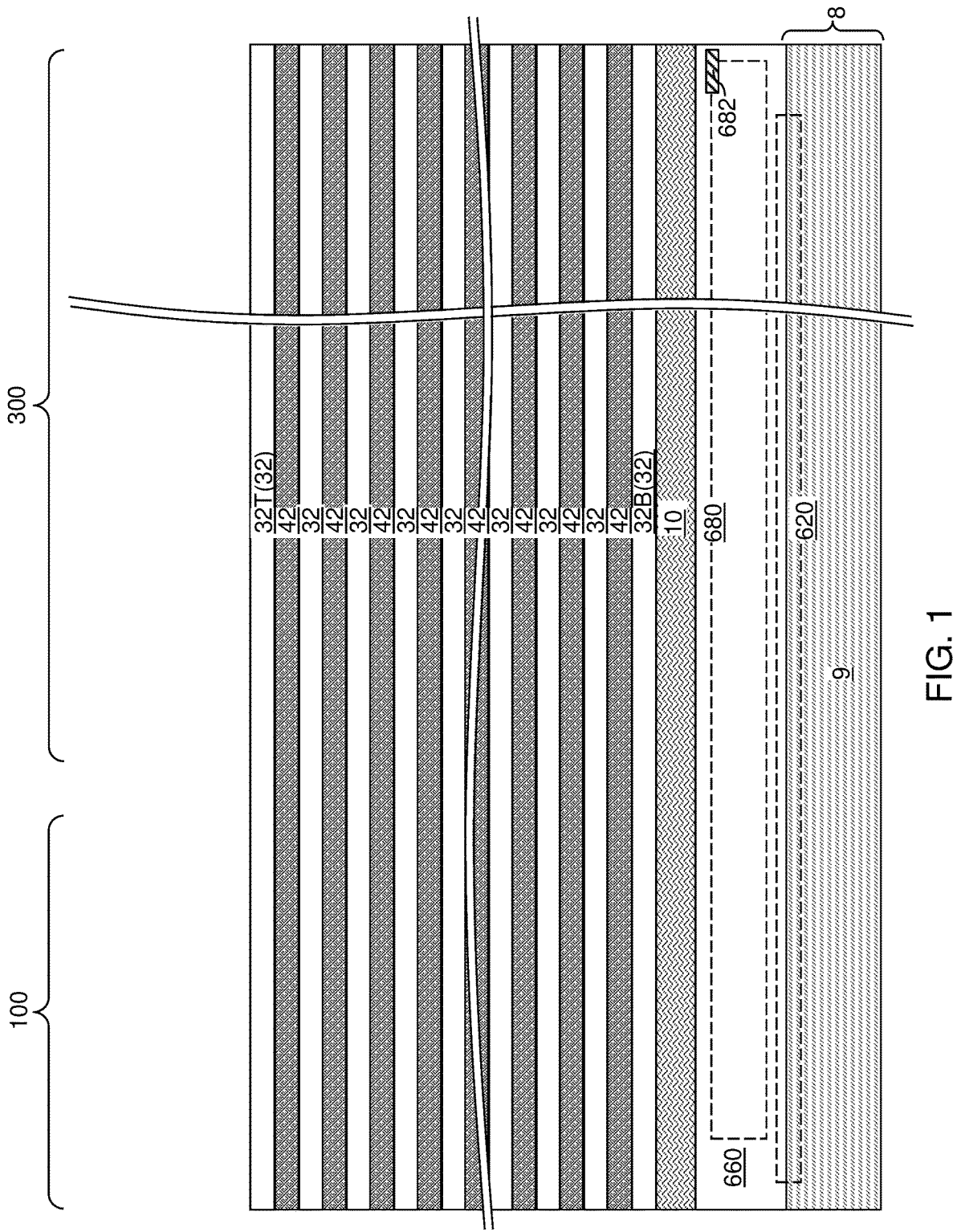
FIG. 1 is a schematic vertical cross-sectional view of an exemplary structure after formation of optional semiconductor devices, optional lower-level metal interconnect structures, a semiconductor material layer, and an alternating stack of insulating layers and sacrificial material layers according to an embodiment of the present disclosure.

As discussed above, embodiments of the present disclosure are directed to a three-dimensional memory device containing composite word lines including a respective fluorine-free capping sublayer and methods of forming the same, the various aspects of which are described below.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, an element located "on" a second element can be located on the exterior side of a surface of the second element or on the interior side of the second element. As used herein, an element is located "directly on" a second element if there exist a physical contact between a surface of the element and a surface of the second element. As used herein, an element is "electrically connected to" a second element if there exists a conductive path consisting of at least one conductive material between the element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a "semiconducting material" refers to a material having electrical conductivity in the range from $1.0\times10^{-6}$ S/cm to $1.0\times10^5$ S/cm. As used herein, a "semiconductor material" refers to a material having electrical conductivity in the range from $1.0\times10^{-6}$ S/cm to $1.0\times10^5$ S/cm in the absence of electrical dopants therein, and is capable of producing a doped material having electrical conductivity in a range from 1.0 S/cm to $1.0\times10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/cm. As used herein, an "insulator material" or a "dielectric material" refers to a material having electrical conductivity less than $1.0\times10^{-6}$ S/cm.

As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated. The exemplary structure comprises a substrate 8, which may be a semiconductor substrate, an insulating substrate, a conductive substrate, or a combination thereof. The substrate 8 comprises a substrate material layer 9, which may or may not be a semiconductor material layer. In one embodiment, the substrate 8 may comprise a semiconductor substrate consisting essentially of a single crystalline semiconductor material or a polycrystalline semiconductor material. In one embodiment, the substrate 8 may be a commercially available silicon wafer on which a plurality of semiconductor dies, such as a two-dimensional array of semiconductor dies, can be subsequently formed. In this case, the substrate material layer 9 may comprise a doped well in the silicon wafer or an epitaxial silicon layer located on the silicon wafer. In case the substrate 8 comprises a semiconductor substrate, semiconductor devices 620 may optionally be formed on top of the substrate 8. Generally, the semiconductor devices 620 may comprise any type of semiconductor devices known in the art. In one embodiment, the semiconductor devices 620 may comprise complementary metal-oxide-semiconductor (CMOS) field effect transistors of a peripheral circuit for controlling operation of a three-dimensional memory device to be subsequently formed thereabove.

Optionally, metal interconnect structures 680 embedded within dielectric material layers 660 may be formed above the substrate 8. The metal interconnect structures 680 are also referred to as lower-level metal interconnect structures 680, and the dielectric material layers 660 are also referred to lower-level dielectric material layers 660. In case the semiconductor devices 620 are present, the lower-level metal interconnect structures 680 may provide electrical connection to the semiconductor devices 620. In one embodiment, the metal interconnect structures 680 may comprise metal pads 682, which may be employed as a contact pad for connection via structures to be subsequently formed. Alternatively, the formation of the semiconductor devices 620, metal interconnect structures 680 and dielectric material layers 660 over the substrate 8 may be omitted. Instead, the semiconductor devices 620 may be formed over a separate substrate and then bonded to the three-dimensional memory device.

In case the lower-level dielectric material layers 660 are present, a semiconductor material layer (e.g., a polysilicon layer) 10 may be formed over the lower-level dielectric material layers 660. The semiconductor material layer 10 may comprise a single semiconductor material layer, or may comprise a vertical stack of multiple semiconductor material sublayers. In one embodiment, the semiconductor material layer 10 may have a doping of a first conductivity type, which may be p-type or n-type. In one embodiment, in-process source-level material layers may be formed in lieu of the semiconductor material layer 10. In this case, the in-process source-level material layers may comprise a vertical stack including a lower source semiconductor layer, a source-level sacrificial layer that is subsequently replaced with a source contact layer, and an upper source semiconductor layer. In case the lower-level dielectric material layers 660 are not employed, the semiconductor material layer 10 may be omitted. While an embodiment is described in which a semiconductor material layer 10 is employed, embodiments are expressly contemplated herein in which the semiconductor material layer is replaced with in-process source-level material layers or is omitted.

An alternating stack of insulating layers 32 and spacer material layers can be formed over the semiconductor material layer 10. In one embodiment, the spacer material layers may comprise sacrificial material layers 42. In this case, an alternating stack (32, 42) of insulating layers 32 and sacrificial material layers 42 can be formed over the semiconductor material layer 10. The insulating layers 32 comprise an insulating material, such as undoped silicate glass (i.e., silicon oxide) or a doped silicate glass, and the sacrificial material layers 42 comprise a sacrificial material such as silicon nitride. The alternating stack (32, 42) may comprise multiple repetitions of a unit layer stack including an insulating layer 32 and a sacrificial material layer 42. The total number of repetitions of the unit layer stack within the alternating stack (32, 42) may be, for example, in a range from 8 to 1,024, such as from 32 to 256, although lesser and greater number of repetitions may also be employed. The topmost one of the insulating layers 32 is hereafter referred to as a topmost insulating layer 32T. The bottommost one of the insulating layers 32 is hereafter referred to as a bottommost insulating layer 32B.

Each of the insulating layers 32 other than the topmost insulating layer 32 may have a thickness in a range from 20 nm to 100 nm, such as from 30 nm to 60 nm, although lesser and greater thicknesses may also be employed. Each of the sacrificial material layers 42 may have a thickness in a range from 20 nm to 100 nm, such as from 30 nm to 60 nm, although lesser and greater thicknesses may also be employed. In one embodiment, the topmost insulating layer 32 may have a thickness of about one half of the thickness of other insulating layers 32.

The exemplary structure may comprise a memory array region 100 in which memory stack structures are to be subsequently formed, and a contact region 300 in which stepped surfaces and contact via structures are to be subsequently formed.

Figure 2:
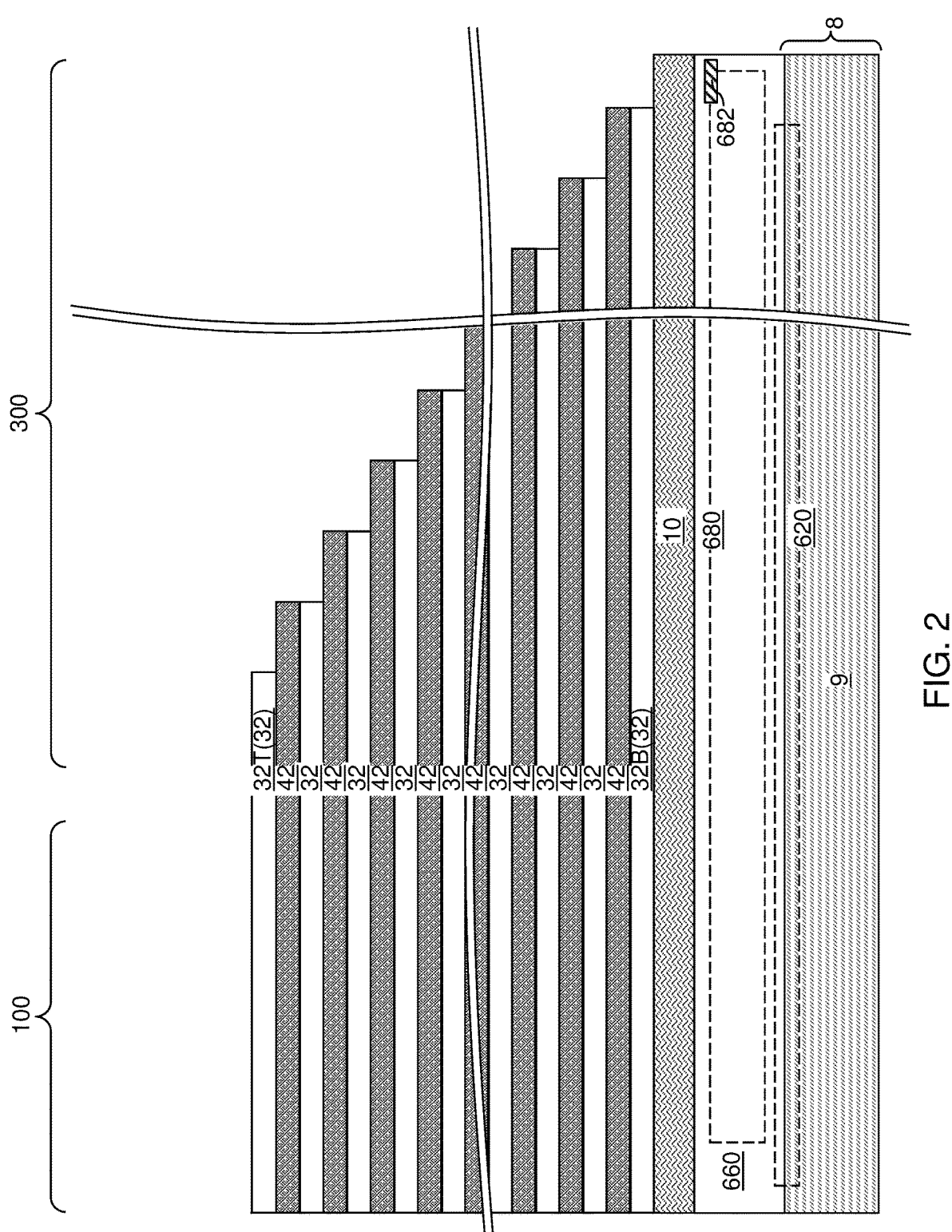
FIG. 2 is a schematic vertical cross-sectional view of the exemplary structure after formation of stepped terraces according to an embodiment of the present disclosure.

Referring to FIG. 2, stepped surfaces are optionally formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The stepped cavity can have various stepped surfaces such that the horizontal cross-sectional shape of the stepped cavity changes in steps as a function of the vertical distance from the top surface of the semiconductor material layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The stepped surfaces of the alternating stack (32, 42) continuously extend from a bottommost layer within the alternating stack (32, 42) (such as the bottommost insulating layer 32B) to a topmost layer within the alternating stack (32, 42) (such as the topmost insulating layer 32T).

Figure 3:
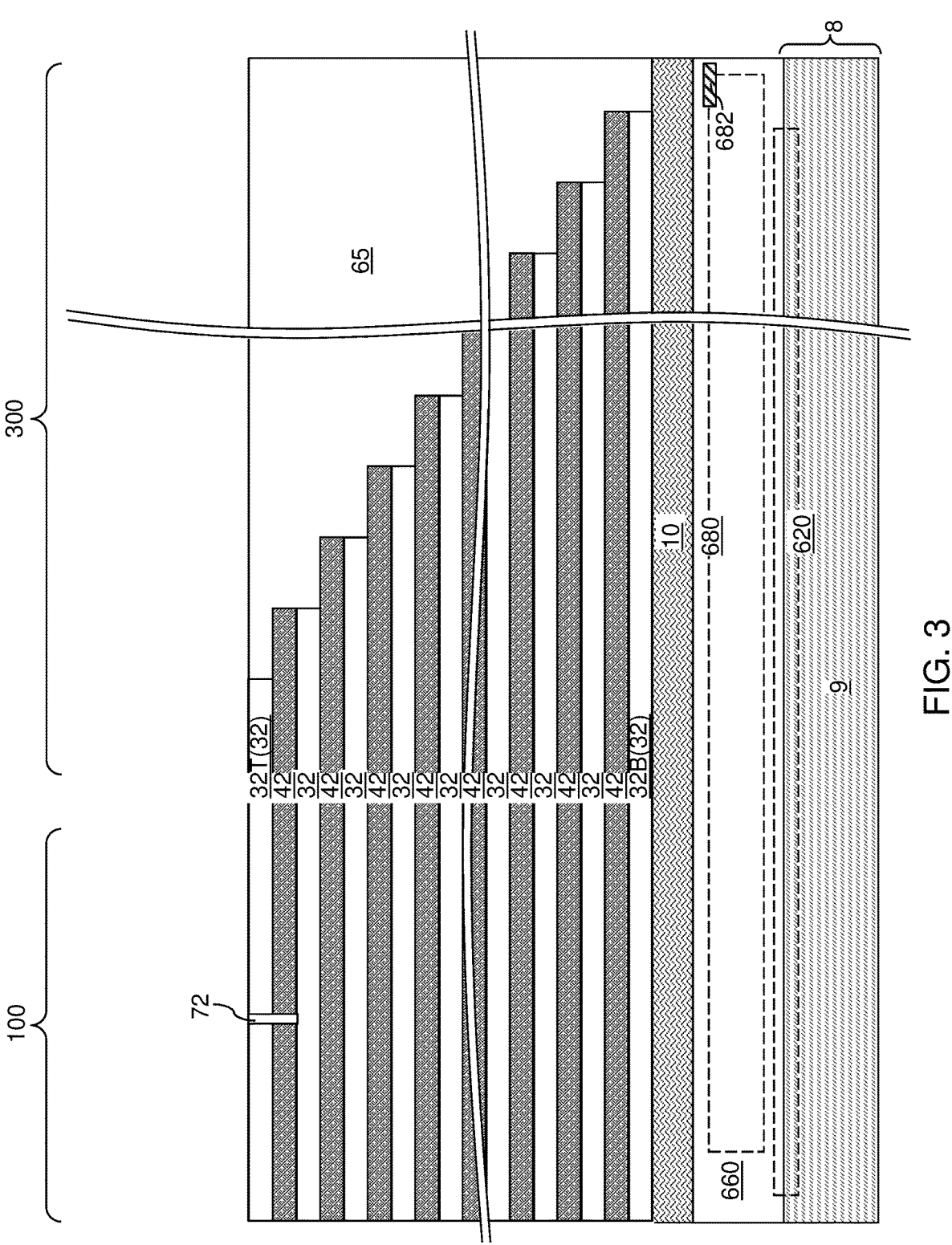
FIG. 3 is a schematic vertical cross-sectional view of the exemplary structure after formation of a retro-stepped dielectric material portion according to an embodiment of the present disclosure.

Referring to FIG. 3, a retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost insulating layer 32T, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the topmost insulating layer 32T and a subset of the sacrificial material layers 42 located at drain-select-levels. The drain-select-level isolation structures 72 can be formed, for example, by forming drain-select-level lateral isolation trenches and filling the drain-select-level lateral isolation trenches with a dielectric material such as silicon oxide. Excess portions of the dielectric material can be removed from above the top surface of the topmost insulating layer 32T.

Figure 4A:
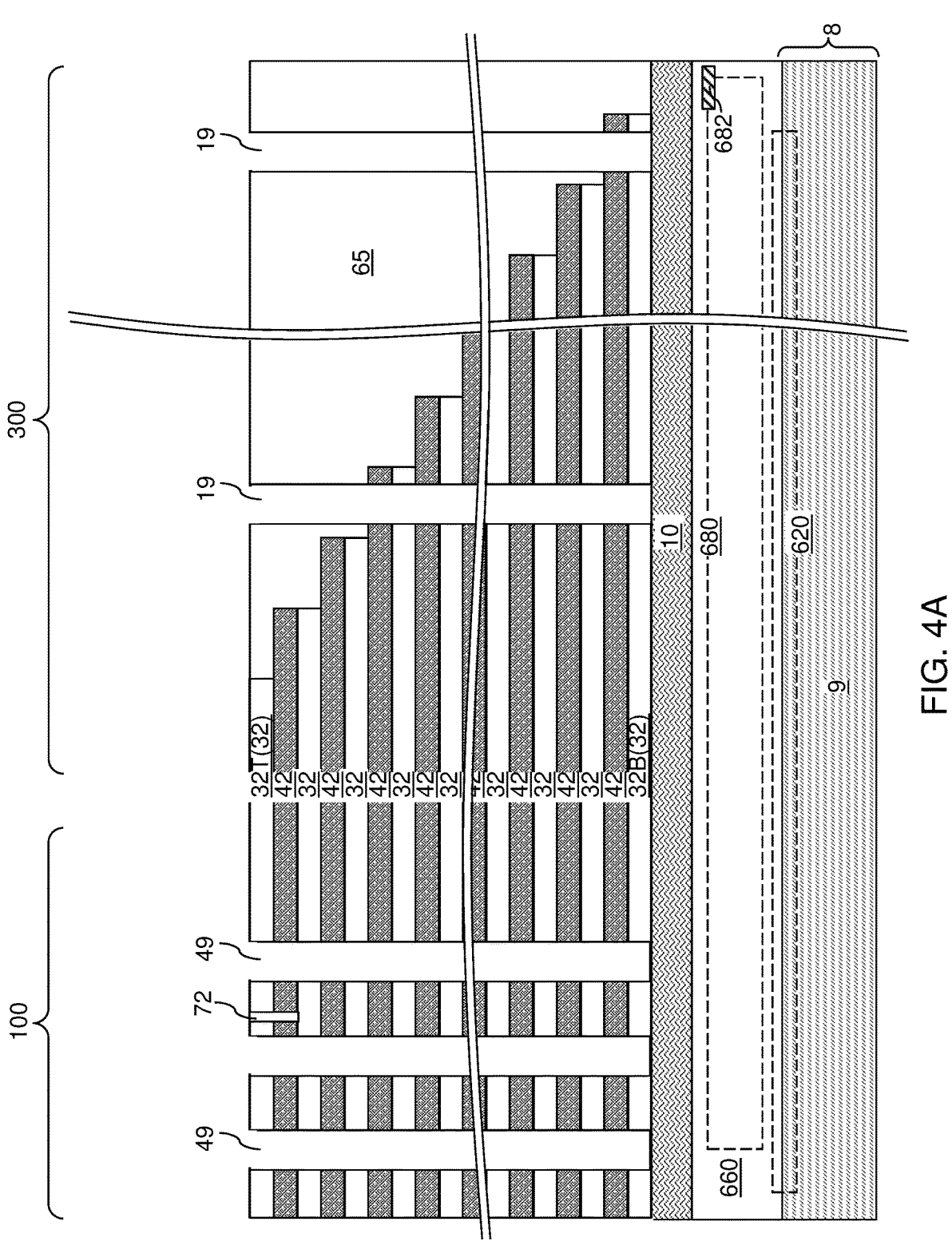
FIG. 4A is a schematic vertical cross-sectional view of the exemplary structure after formation of memory openings and support openings according to an embodiment of the present disclosure.
Figure 4B:
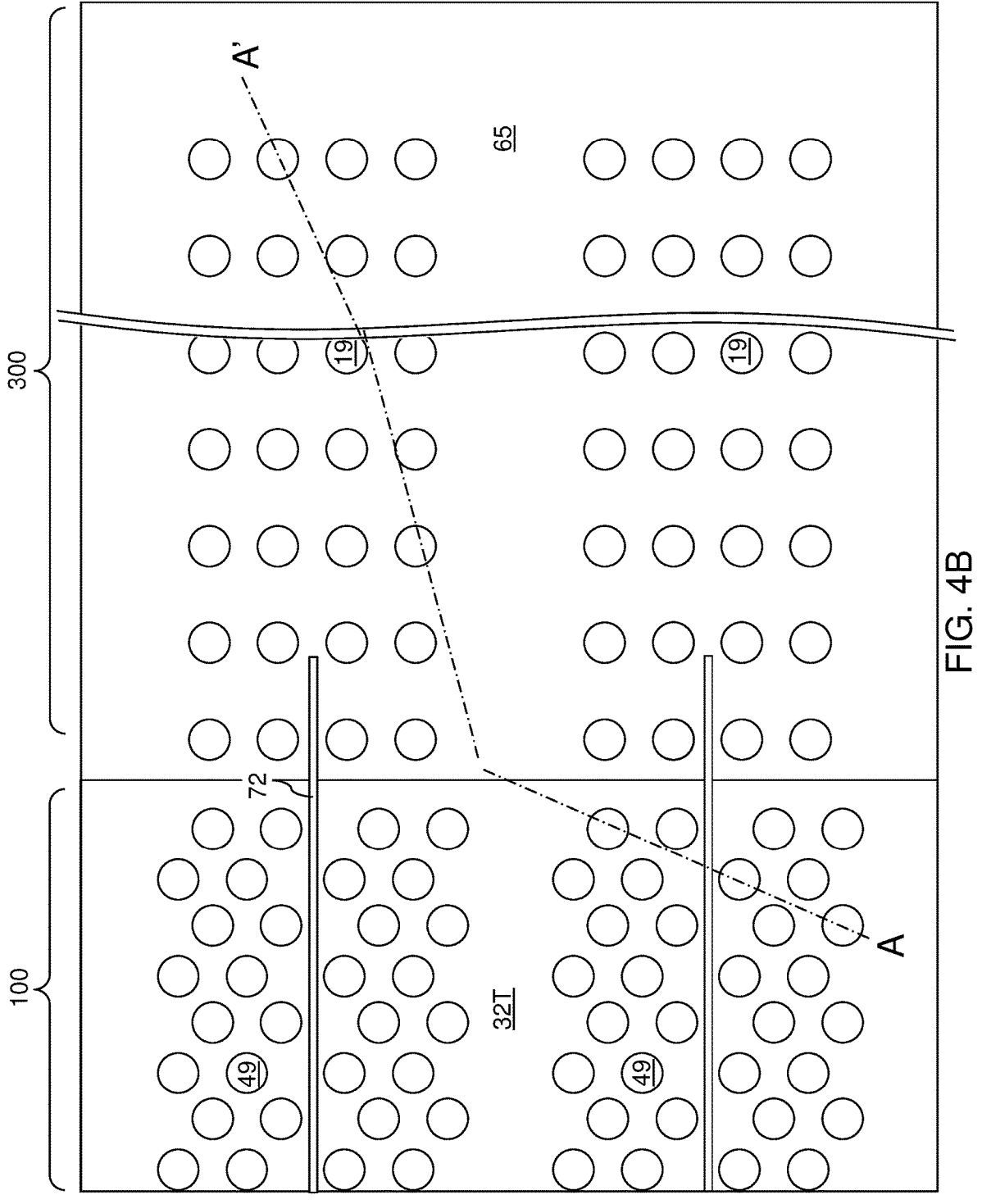
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the topmost insulating layer 32T and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the topmost insulating layer 32T or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the topmost insulating layer 32T and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. In one embodiment, the recessed surfaces of the semiconductor material layer 10 may be vertically offset from the un-recessed top surfaces of the semiconductor material layer 10 by a recess depth. The recess depth can be, for example, in a range from 0 nm to 30 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate 8. A two-dimensional array of memory openings 49 can be formed in the memory array region 100. A two-dimensional array of support openings 19 can be formed in the contact region 300.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Figures 5A, 5B:
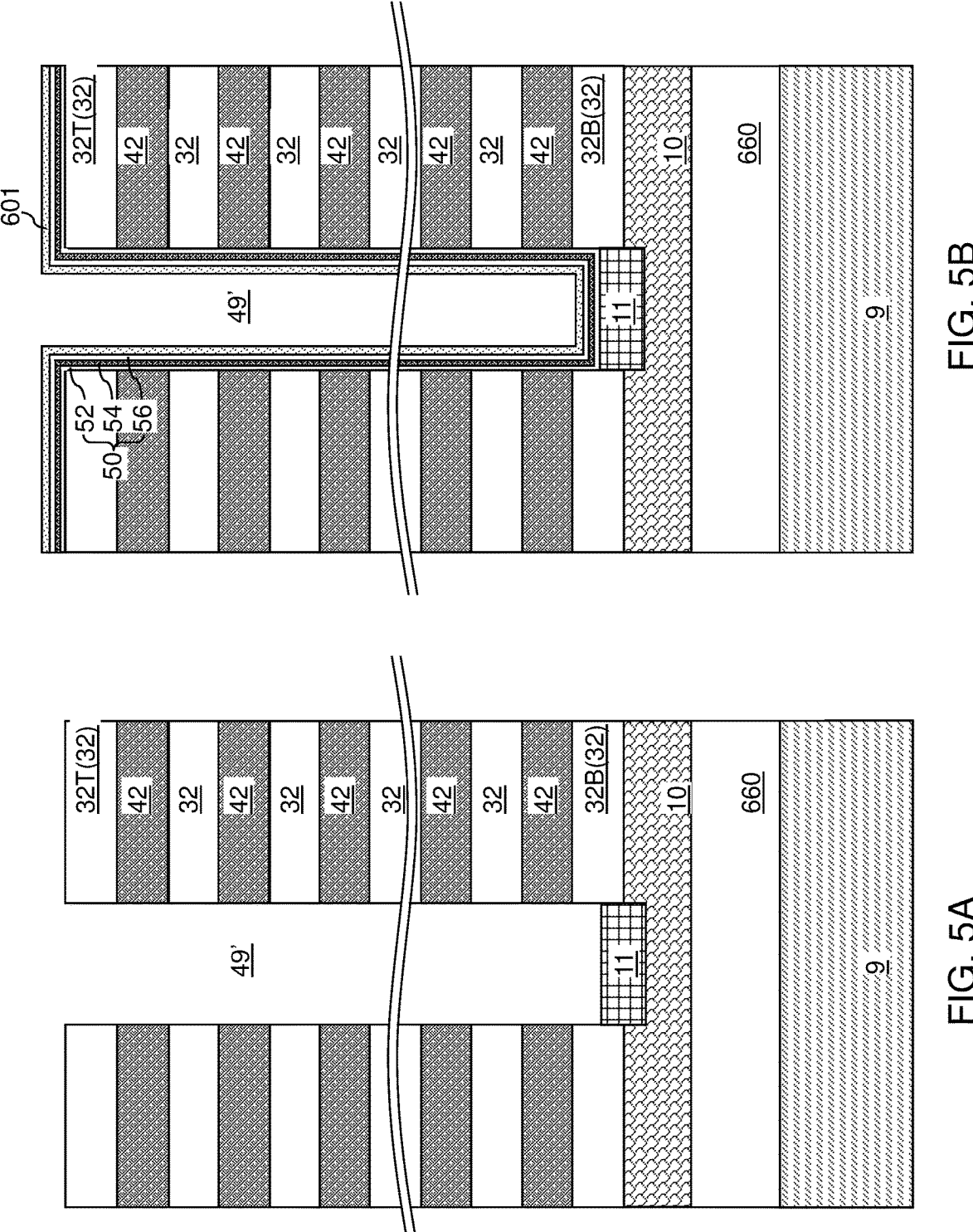
FIGS. 5A-5F are sequential schematic vertical cross-sectional views of a memory opening within the exemplary structure during formation of a memory opening fill structure according to an embodiment of the present disclosure.

Referring to FIG. 5A, a memory opening 49 in the exemplary device structure of FIGS. 4A and 4B is illustrated. The memory opening 49 extends through the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

An optional pedestal channel portion 11 (which may be an epitaxial pedestal) can be formed at the bottom portion of each memory opening 49 and each support openings 19, for example, by a selective semiconductor deposition process. In one embodiment, the pedestal channel portion 11 can be doped with electrical dopants of the same first conductivity type as the semiconductor material layer 10. In one embodiment, the top surface of each pedestal channel portion 11 can be formed below a horizontal plane including the top surface of the bottommost insulating layer 32B. The pedestal channel portion 11 can be a portion of a transistor channel. A memory cavity 49' is present in the unfilled portion of the memory opening 49 above the pedestal channel portion 11. If the semiconductor material layer 10 comprises a single crystalline semiconductor material, the pedestal channel portion 11 may comprise a single crystalline semiconductor material in epitaxial alignment with the single crystalline semiconductor material of the semiconductor material layer 10. In one embodiment, the pedestal channel portion 11 can comprise single crystalline silicon.

Referring to FIG. 5B, a stack of layers including a blocking dielectric layer 52, a memory material layer 54, and a dielectric liner layer 56 can be deposited in each memory opening 49. The stack of layers is herein referred to as a memory film 50.

The blocking dielectric layer 52 can include a single dielectric material layer or a stack of a plurality of dielectric material layers. In one embodiment, the blocking dielectric layer 52 can include a dielectric metal oxide layer consisting essentially of a dielectric metal oxide. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed.

The memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer. Generally, the memory material layer 54 may comprise a vertical stack of memory elements that are located at levels of the sacrificial material layers 42. For example, the vertical stack of memory elements may be embodied as annular portions of the memory material layer 54 located at levels of the sacrificial material layers 42.

The optional dielectric liner 56, if present, comprises a dielectric liner material. In one embodiment, the dielectric liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed. Optionally, a sacrificial cover material layer 601 may be formed over the memory film 50.

Figures 5C, 5D:
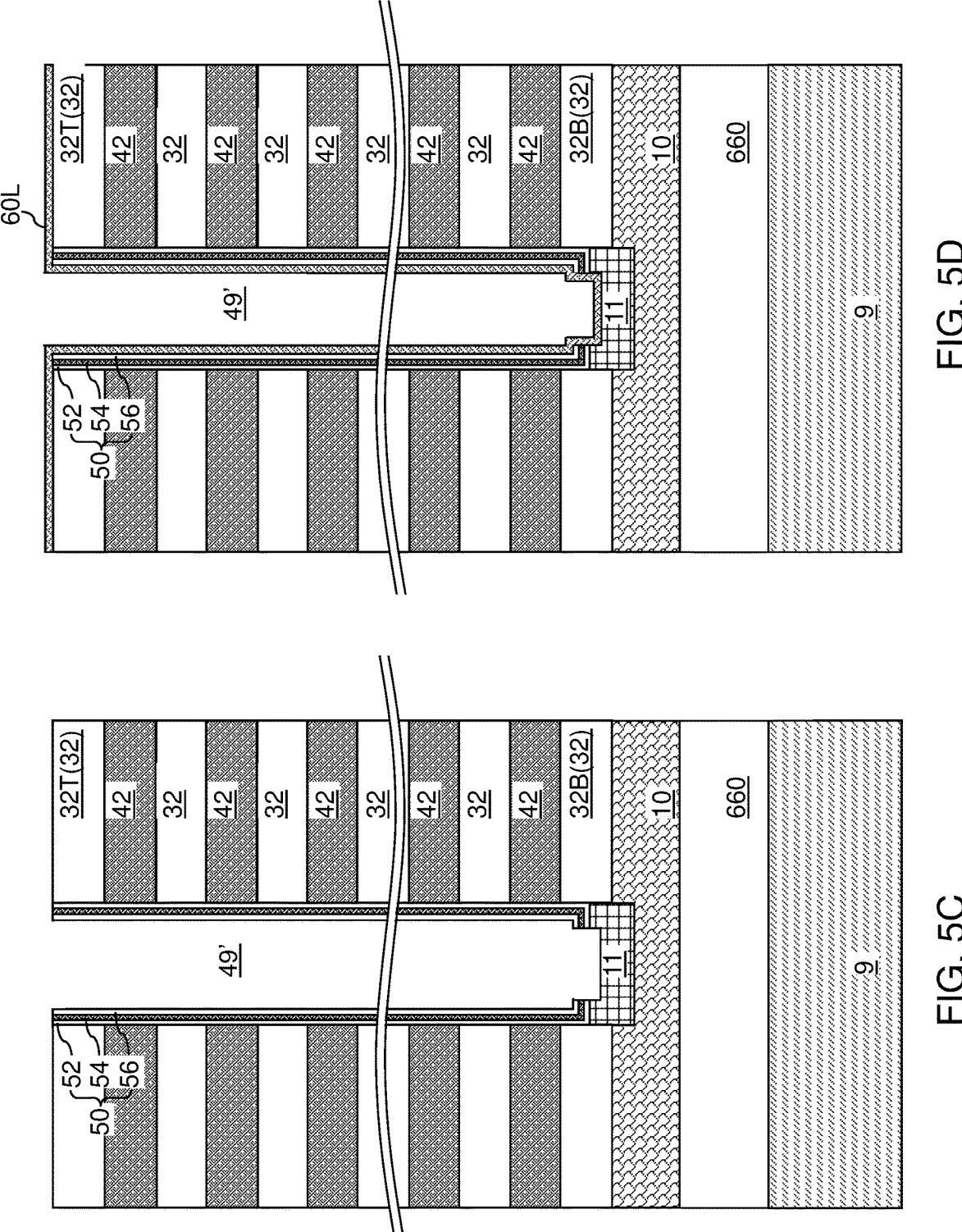

Referring to FIG. 5C, the optional sacrificial cover material layer 601, the dielectric liner 56, the memory material layer 54, the blocking dielectric layer 52 are sequentially anisotropically etched employing at least one anisotropic etch process. The portions of the sacrificial cover material layer 601, the dielectric liner 56, the memory material layer 54, and the blocking dielectric layer 52 located above the top surface of the topmost insulating layer 32T can be removed by the at least one anisotropic etch process. Further, the horizontal portions of the sacrificial cover material layer 601, the dielectric liner 56, the memory material layer 54, and the blocking dielectric layer 52 at a bottom of each memory cavity 49' can be removed to form openings in remaining portions thereof. Each of the sacrificial cover material layer, the dielectric liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer can have a tubular configuration. A surface of the pedestal channel portion 11 (or a surface of the semiconductor material layer 10 in case a pedestal channel portion 11 is not employed) can be physically exposed underneath the opening through the sacrificial cover material layer 601, the dielectric liner 56, the memory material layer 54, and the dielectric metal oxide blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. In one embodiment, the sacrificial cover material layer, the dielectric liner 56, the memory material layer 54, and the blocking dielectric layer 52 can have vertically coincident sidewalls. The sacrificial cover material layer can be subsequently removed selective to the material of the dielectric liner 56. In case the sacrificial cover material layer includes amorphous silicon, a wet etch process employing hot trimethyl-2 hydroxyethyl ammonium hydroxide ("hot TMY") or tetramethyl ammonium hydroxide (TMAH) can be performed to remove the sacrificial cover material layer. Alternatively, the sacrificial cover material layer may be retained in the final device if it comprises a semiconductor material.

Referring to FIG. 5D, a semiconductor channel layer 60L can be deposited directly on the semiconductor surface of the pedestal channel portion 11 or the semiconductor material layer 10 if the pedestal channel portion 11 is omitted, and directly on the memory film 50. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Figures 5E, 5F:
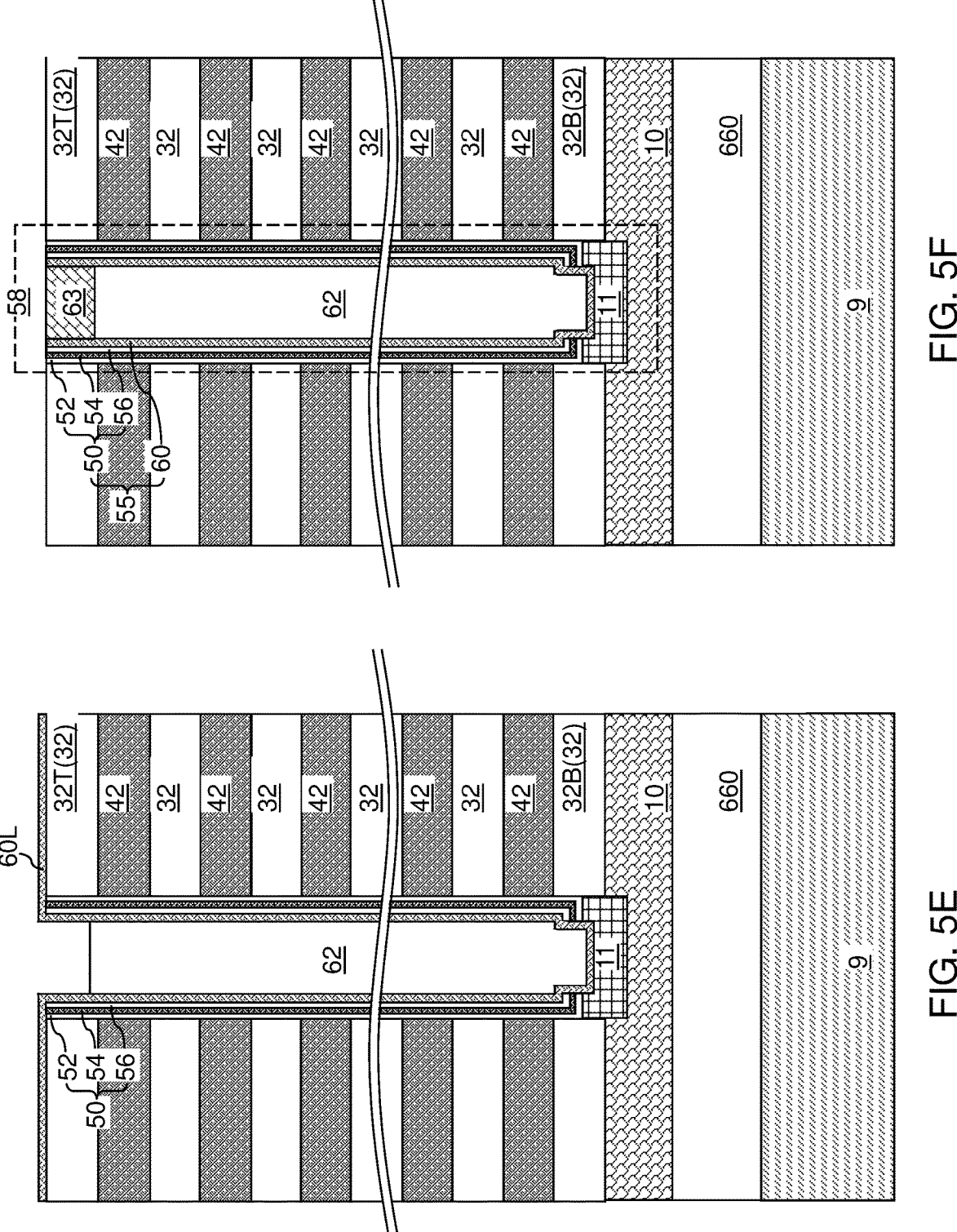

Referring to FIG. 5E, a dielectric core layer can be deposited to fill any remaining portion of the memory cavity 49' within each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch process such that each remaining portions of the dielectric core layer is located within a respective memory opening 49 and has a respective top surface below the horizontal plane including the top surface of the topmost insulating layer 32T. Each remaining portion of the dielectric core layer constitutes a dielectric core 62.

Referring to FIG. 5F, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the topmost insulating layer 32T, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each combination of a memory film 50 and a vertical semiconductor channel 60 within a memory opening 49 constitutes a memory stack structure 55. The memory stack structure 55 is a combination of a semiconductor channel 60, a tunneling dielectric layer, a plurality of memory elements comprising portions of the memory material layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
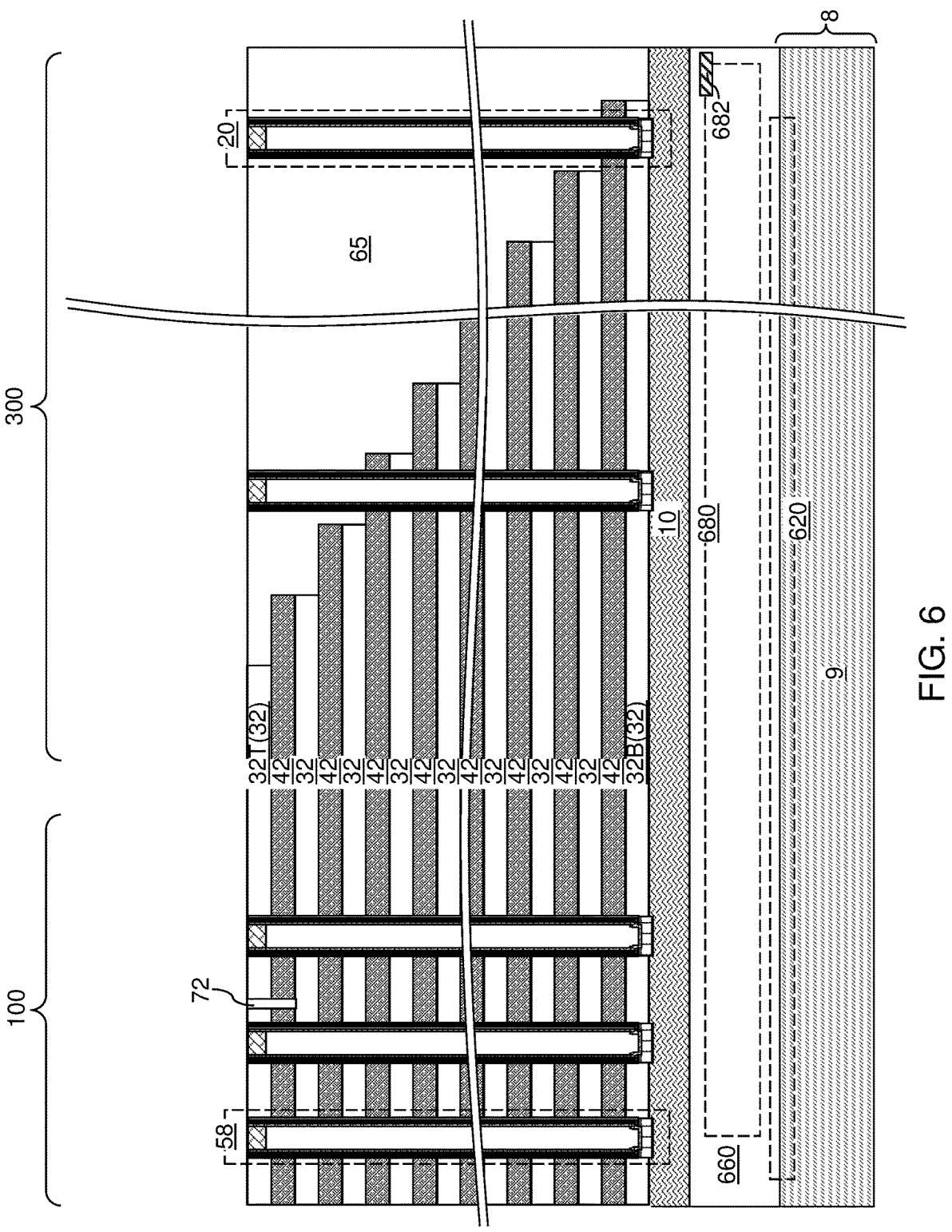
FIG. 6 is a schematic vertical cross-sectional view of the exemplary structure after formation of memory opening fill structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

While an embodiment described employing the configuration of FIGS. 5F and 6 for the memory stack structure 55, alternative memory stack structures including different layer stacks or structures for the memory film 50 and/or for the vertical semiconductor channel 60 may be used instead.

Figure 7A:
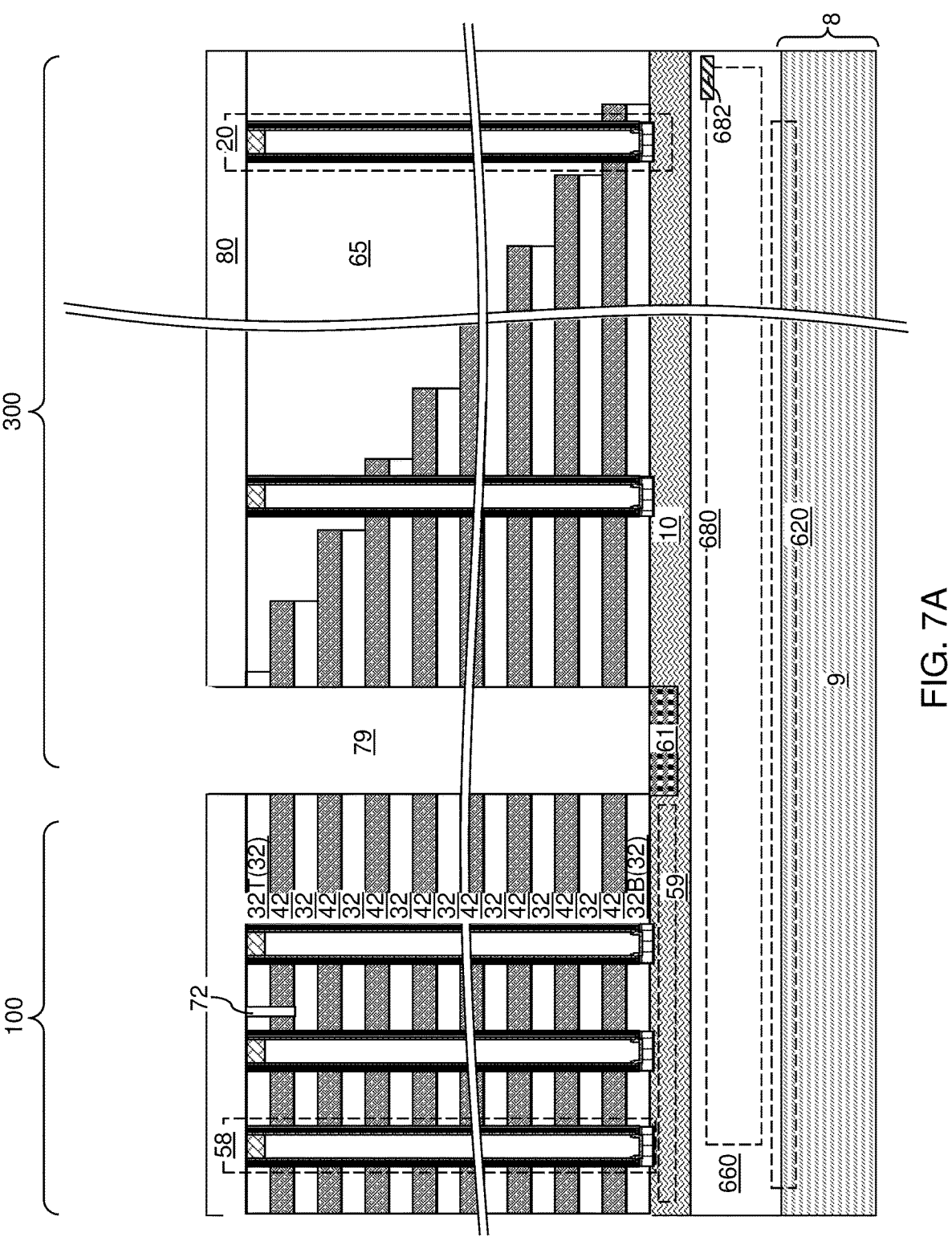
FIG. 7A is a schematic vertical cross-sectional view of the exemplary structure after formation of a contact-level dielectric layer, lateral isolation trenches, and source regions according to an embodiment of the present disclosure.
Figure 7B:
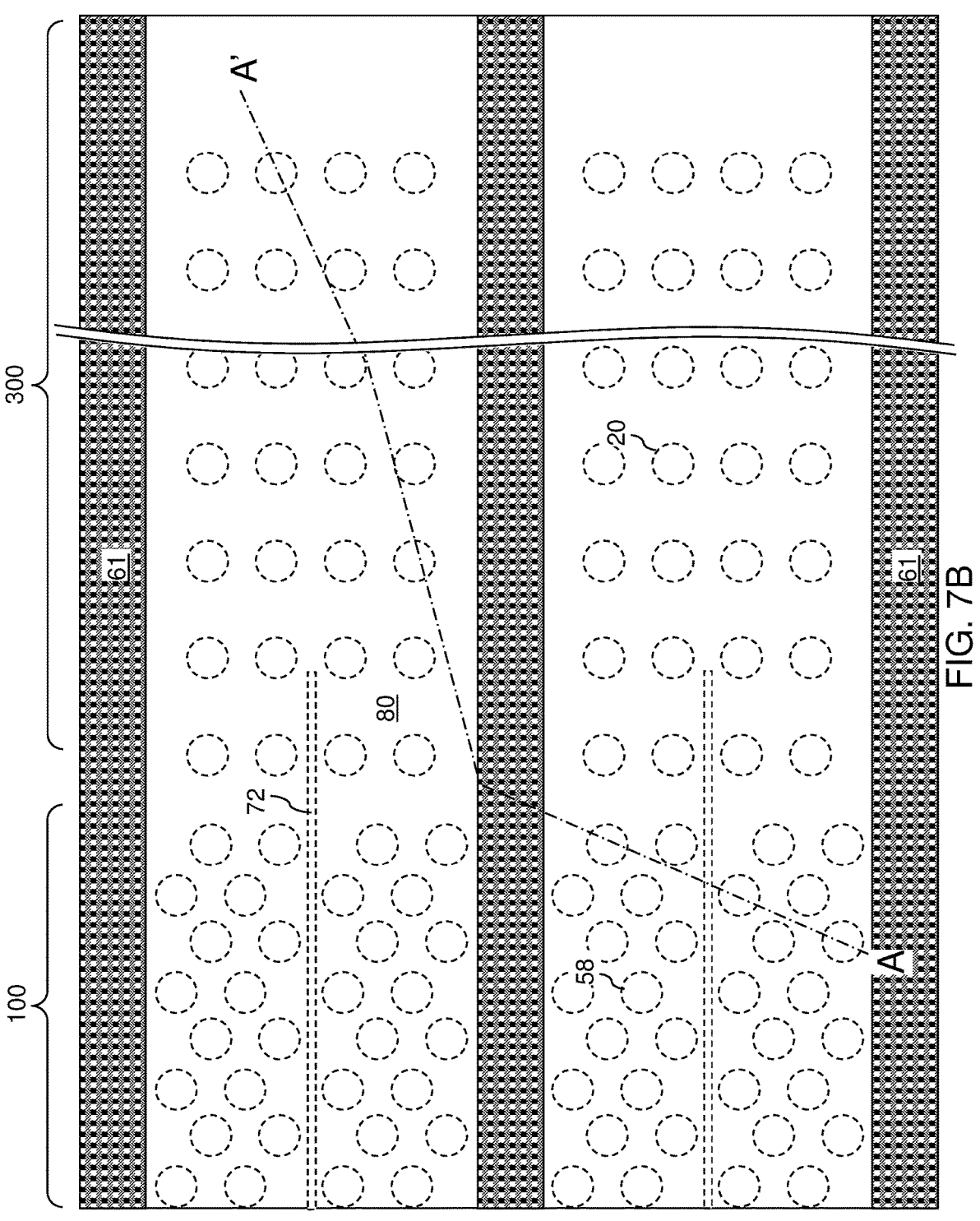
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact-level dielectric layer 80 can be formed over the alternating stack (32, 42), and over the memory opening fill structures 58 and the support pillar structures 20. The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form openings in areas between clusters of memory stack structures 55. The pattern in the photoresist layer can be transferred through the contact-level dielectric layer 80, the alternating stack (32, 42) and/or the retro-stepped dielectric material portion 65 employing an anisotropic etch to form lateral isolation trenches 79, which vertically extend from the top surface of the contact-level dielectric layer 80 at least to the top surface of the semiconductor material layer 10, and laterally extend through the memory array region 100 and the contact region 300.

In one embodiment, the lateral isolation trenches 79 can laterally extend along a first horizontal direction (e.g., word line direction) hd1 and can be laterally spaced apart among one another along a second horizontal direction (e.g., bit line direction) hd2 that is perpendicular to the first horizontal direction hd1. The memory opening fill structures 58 can be arranged in rows that extend along the first horizontal direction hd1. The drain-select-level isolation structures 72 can laterally extend along the first horizontal direction hd1. Each lateral isolation trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory opening fill structures can be located between a neighboring pair of a lateral isolation trench 79 and a drain-select-level isolation structure 72, or between a neighboring pair of drain-select-level isolation structures 72. In one embodiment, the lateral isolation trenches 79 can include a source contact opening in which a source contact via structure can be subsequently formed. The photoresist layer can be removed, for example, by ashing. Generally, lateral isolation trenches 79 laterally extending along the first horizontal direction hd1 can be formed through the contact-level dielectric layer 80 and the alternating stack (32, 42). The alternating stack (32, 42) is divided into multiple alternating stacks (32, 42) that are laterally spaced apart along the second horizontal direction hd2 by the lateral isolation trenches 79. Layer stacks (32, 42, 80) are formed, each of which includes a respective patterned portion of the contact-level dielectric layer 80 and a respective patterned portion of the alternating stack (32, 42) as formed at the processing steps of FIG. 1 and laterally spaced from each other by the lateral isolation trenches 79.

Dopants of the second conductivity type can optionally be implanted into physically exposed surface portions of the semiconductor material layer 10 that are located at the bottom of the lateral isolation trenches 79 by an ion implantation process. An optional source region 61 can be formed at a surface portion of the semiconductor material layer 10 under each lateral isolation trench 79. Due to the straggle of the implanted dopant atoms during the implantation process and lateral diffusion of the implanted dopant atoms during a subsequent activation anneal process, each source region 61 can have a lateral extent greater than the lateral extent of the lateral extent of the overlying lateral isolation trench 79. Alternatively, the source region 61 in the semiconductor material layer 10 may be replaced by a horizontal source line (e.g., direct strap contact) which contacts a sidewall of the vertical semiconductor channel 60 or by a source layer (e.g., top source contact) which is formed on bottom tips of the vertical semiconductor channel 60 after removal of the substrate 8 and any layers located between the substrate and the vertical semiconductor channel 60.

An upper portion of the semiconductor material layer 10 that extends between the source region 61 and the plurality of pedestal channel portions 11 constitutes an optional horizontal semiconductor channel 59 for a plurality of field effect transistors. The horizontal semiconductor channel 59 is connected to multiple vertical semiconductor channels 60 through respective pedestal channel portions 11. Each horizontal semiconductor channel 59 contacts a source region 61 and a plurality of pedestal channel portions 11.

Figure 8:
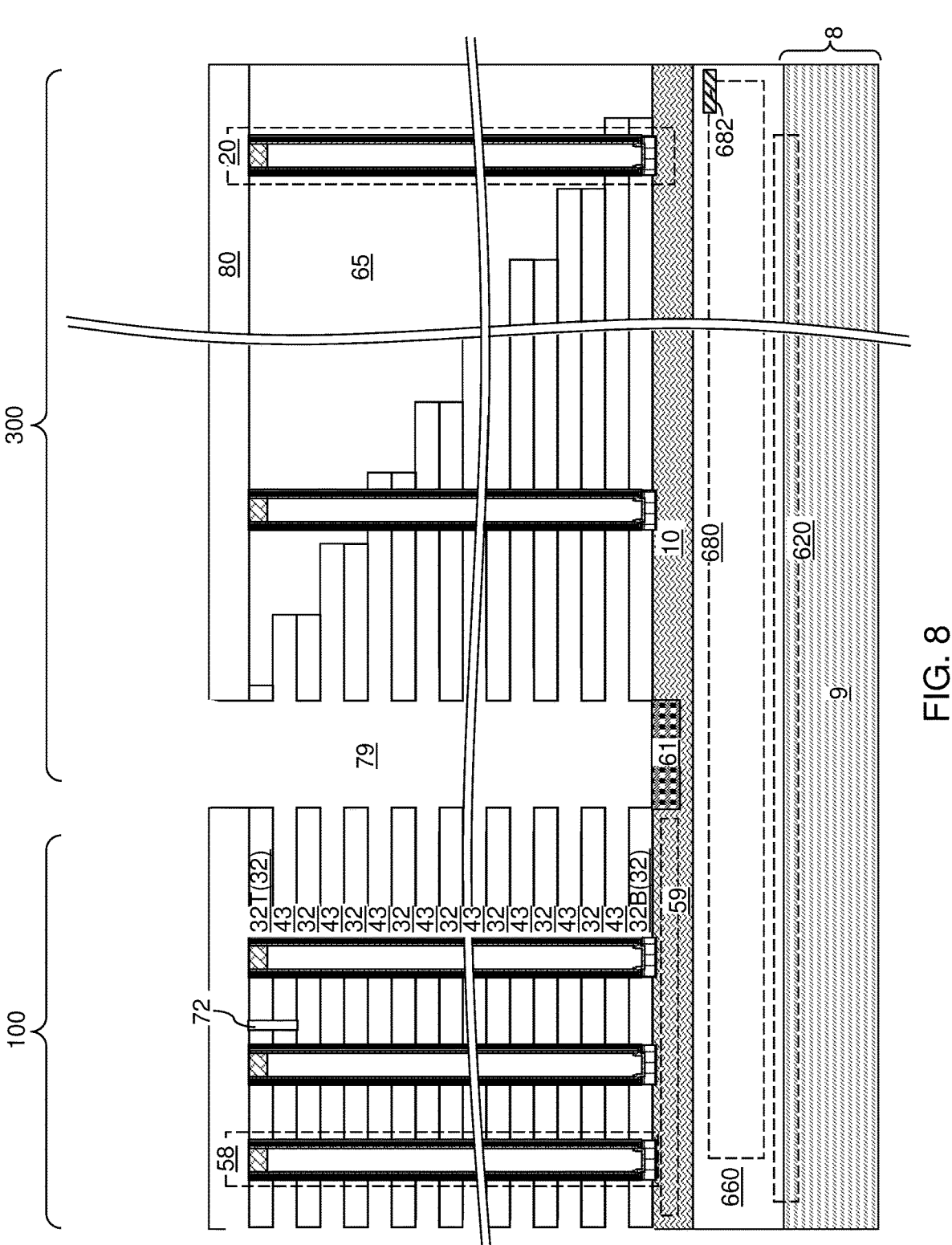
FIG. 8 is a schematic vertical cross-sectional view of the exemplary structure after formation of lateral recesses according to an embodiment of the present disclosure.
Figure 9A:
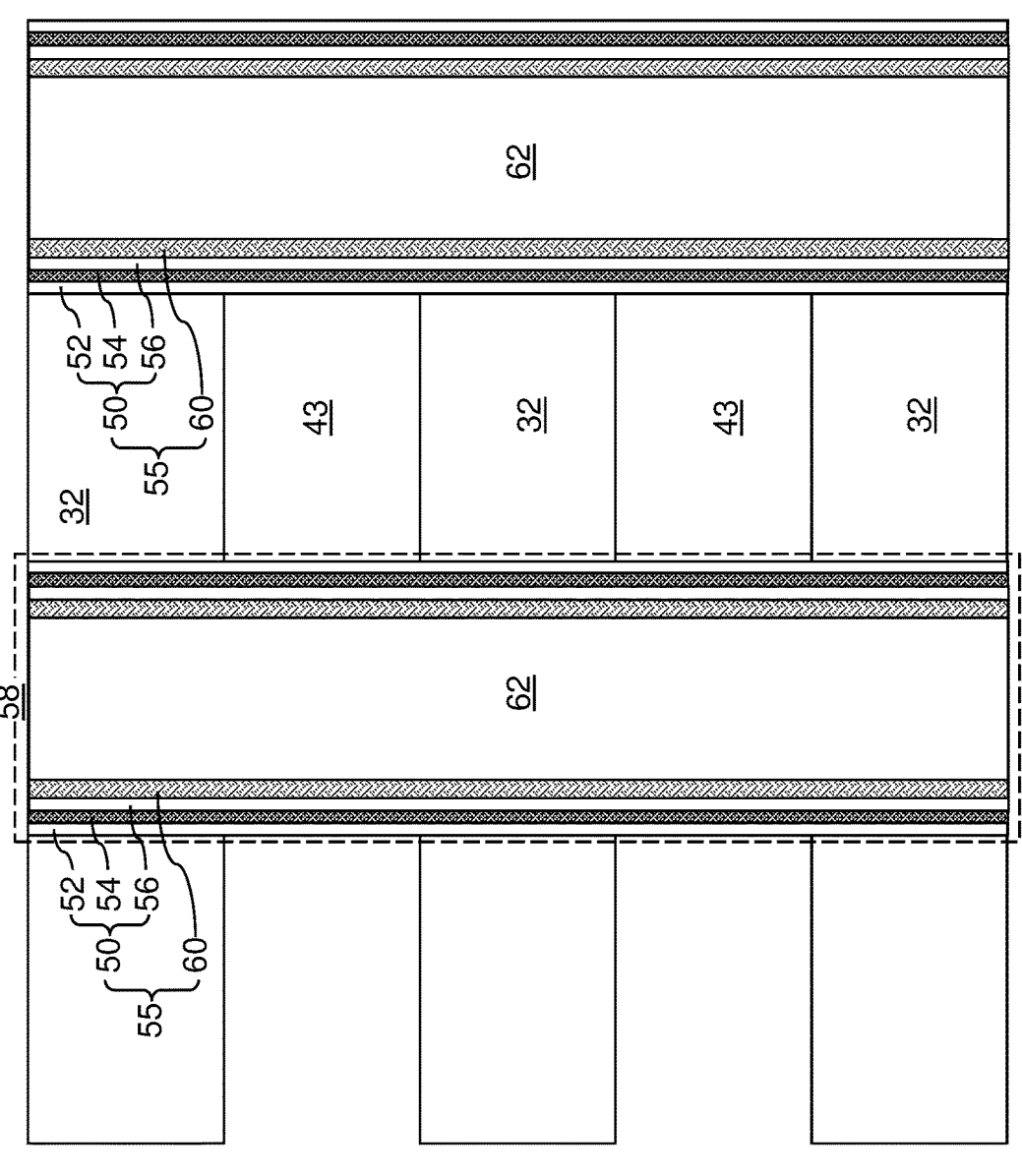
FIGS. 9A-9F and 9H are sequential vertical cross-sectional views of a region of the exemplary structure around a memory opening fill structure during formation of electrically conductive layers according to an embodiment of the present disclosure.

Referring to FIGS. 8 and 9A, an etchant that selectively etches the second material of the sacrificial material layers 42 with respect to the first material of the insulating layers 32 can be introduced into the lateral isolation trenches 79. Lateral recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be silicon oxide.

The etch process that removes the second material selective to the first material and the outermost layer of the memory films 50 can be a wet etch process employing a wet etch solution, or can be a gas phase (dry) etch process in which the etchant is introduced in a vapor phase into the lateral isolation trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the second material of the sacrificial material layers 42 is removed. The memory openings 49 in which the memory stack structures 55 are formed are herein referred to as front side openings or front side cavities in contrast with the lateral recesses 43. In one embodiment, the memory array region 100 comprises an array of three-dimensional NAND strings having a plurality of device levels located above the semiconductor material layer 10. In this case, each lateral recess 43 can define a space for receiving a respective word line or select gate line of the array of three-dimensional NAND strings.

Each of the plurality of lateral recesses 43 can extend substantially parallel to the top surface of the semiconductor material layer 10. A lateral recess 43 can be vertically bounded by a top surface of an underlying insulating layer 32 and a bottom surface of an overlying insulating layer 32. In one embodiment, each lateral recess 43 can have a uniform height throughout. Generally, the lateral recesses 43 can be formed by removing the sacrificial material layers 42 selective to the insulating layers 32.

Figure 9B:
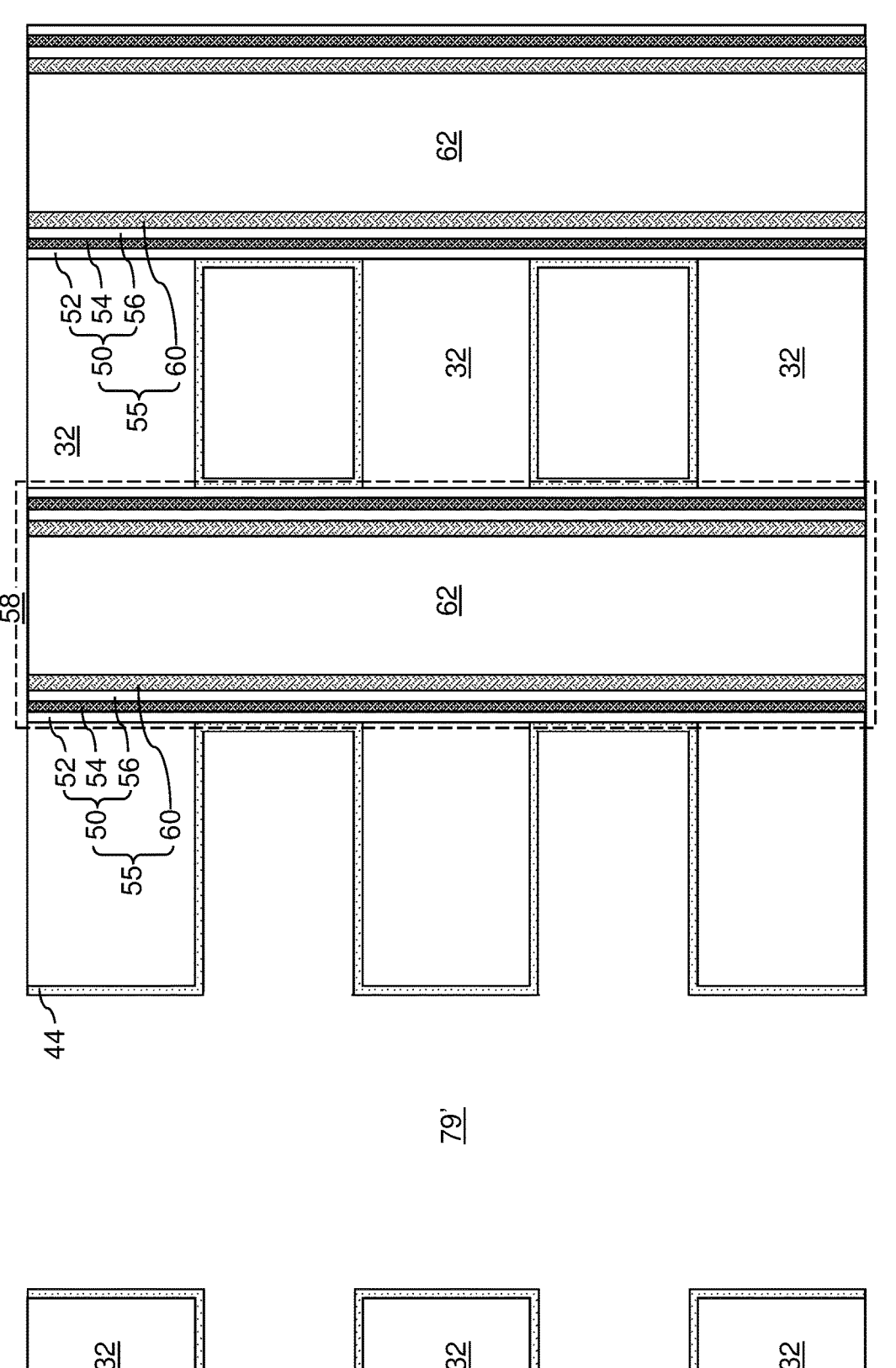

Referring to FIG. 9B, an outer blocking dielectric layer 44 can be optionally formed. The outer blocking dielectric layer 44, if present, comprises a dielectric material that functions as a control gate dielectric for the control gates (i.e., portions of the word lines) to be subsequently formed in the lateral recesses 43. In case the blocking dielectric layer 52 is present within each memory opening 49, the outer blocking dielectric layer 44 is optional. In case the blocking dielectric layer 52 is omitted, the outer blocking dielectric layer 44 may be present.

The outer blocking dielectric layer 44 can be formed in the lateral recesses 43 and on a sidewall of the lateral isolation trench 79. The outer blocking dielectric layer 44 can be formed directly on horizontal surfaces of the insulating layers 32 and sidewalls of the memory stack structures 55 within the lateral recesses 43. In one embodiment, the outer blocking dielectric layer 44 can be formed by a conformal deposition process, such as atomic layer deposition (ALD). The outer blocking dielectric layer 44 can consist essentially of aluminum oxide. The thickness of the outer blocking dielectric layer 44 can be in a range from 1 nm to 15 nm, such as 2 to 6 nm, although lesser and greater thicknesses can also be employed.

The dielectric material of the outer blocking dielectric layer 44 can be a dielectric metal oxide, such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the outer blocking dielectric layer 44 can include a silicon oxide layer. A lateral isolation cavity 79' is present within the portion of each lateral isolation trench 79 that is not filled with the outer blocking dielectric layer 44.

Figure 9C:
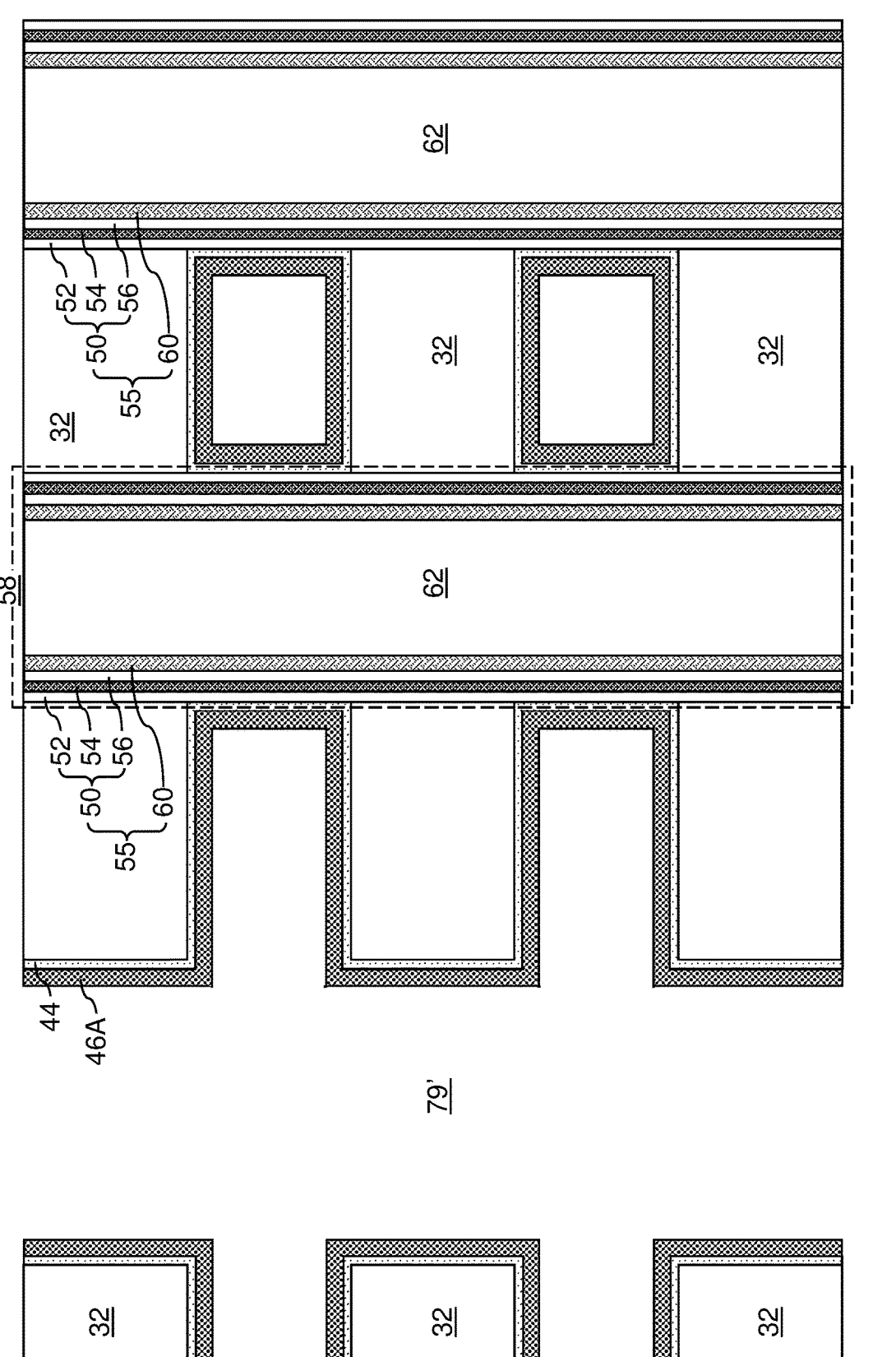

Referring to FIG. 9C, an optional conductive metallic barrier liner 46A can be deposited in first volumes of the lateral recesses 43. The conductive metallic barrier liner 46A includes an electrically conductive metallic material that can function as a diffusion barrier layer and/or adhesion promotion layer for a tungsten fill material to be subsequently deposited. The conductive metallic barrier liner 46A can include a conductive metallic nitride material such as TiN, TaN, WN, or a stack thereof; a conductive metallic carbide material such as TiC, TaC, WC, or a stack thereof; or a conductive metallic carbonitride material such as WCN, TiCN, TaCN, or a stack thereof. In one embodiment, the conductive metallic barrier liner 46A can be deposited by a conformal deposition process such as chemical vapor deposition (CVD) or atomic layer deposition (ALD). The thickness of the conductive metallic barrier liner 46A can be in a range from 2 nm to 8 nm, such as from 3 nm to 6 nm, although lesser and greater thicknesses can also be employed. In one embodiment, the conductive metallic barrier liner 46A can consist essentially of a conductive metal nitride, such as TiN. The conductive metallic barrier liner 46A is in direct contact with the outer blocking dielectric layer 44 (if present) or the inner blocking dielectric layer 52 if the outer blocking dielectric layer 44 is omitted.

Figure 9D:
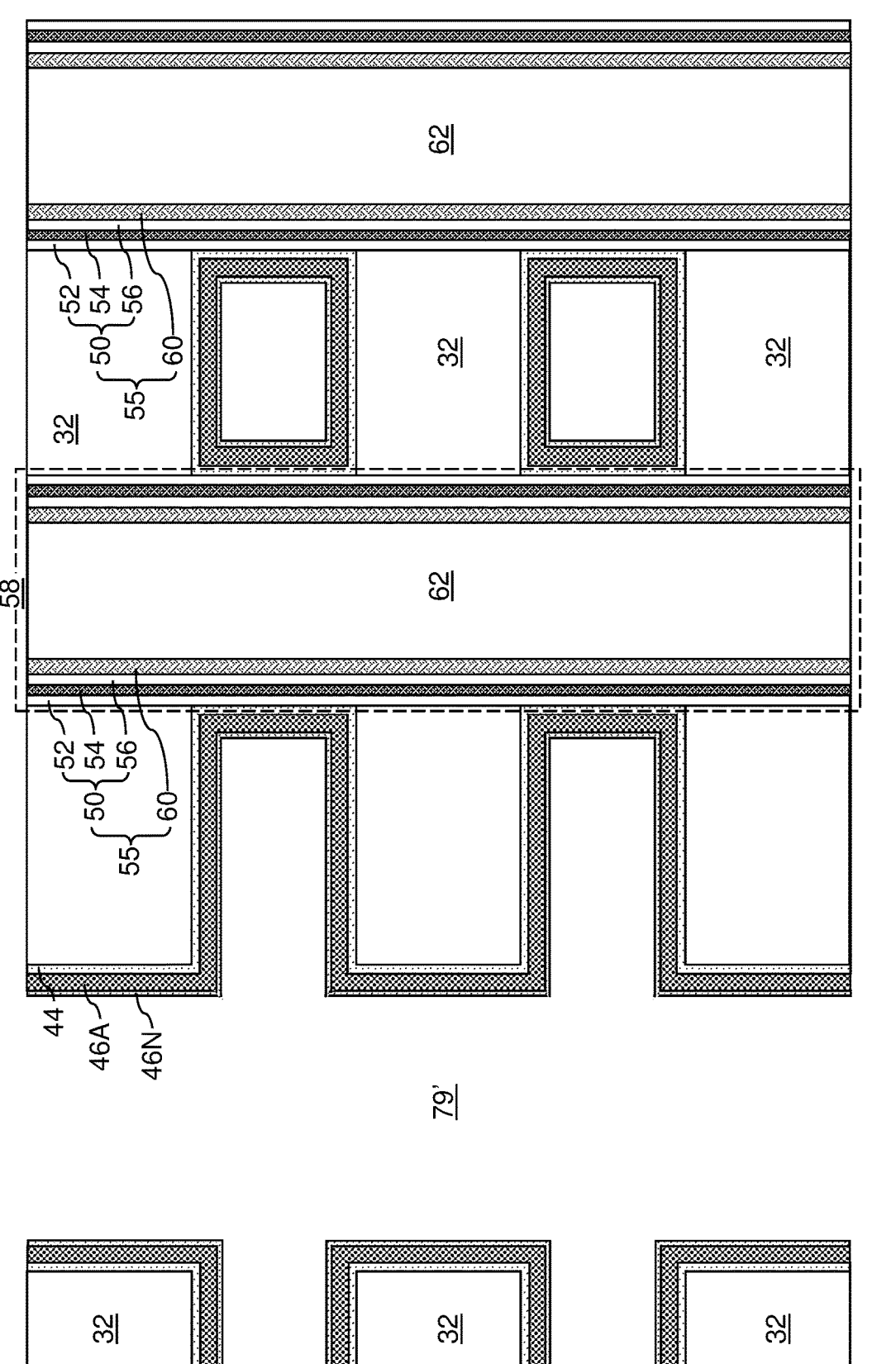

Referring to FIG. 9D, a non-metal nucleation layer 46N may be formed on the physically exposed surfaces of the conductive metallic barrier liner 46A by performing a soaking process that induces adsorption of non-metal atoms that can be subsequently employed to induce nucleation of tungsten. For example, the exemplary structure can be placed in a vacuum chamber, and can be soaked in a low pressure ambient including a silicon or boron hydride gas such as silane ($SiH_4$) or diborane ($B2H_6$) as a primary component gas. Silicon atoms or boron atoms can be adsorbed to the physically exposed surfaces of the conductive metallic barrier liner 46A to form the non-metal nucleation layer 46N. The non-metal nucleation layer 46N includes a monolayer or a sub-monolayer of silicon atoms or boron atoms. The surface coverage of the conductive metallic barrier liner 46A by the atoms within the non-metal nucleation layer 46N may be in a range from 1% to 100%, such as from 3% to 30%, although a lower surface coverage may also be employed. The surface coverage refers to a percentage of the area covered by atoms of an overlying layer relative to the area of the underlying layer. Alternatively, the non-metal nucleation layer 46N may be omitted.

Figure 9E:
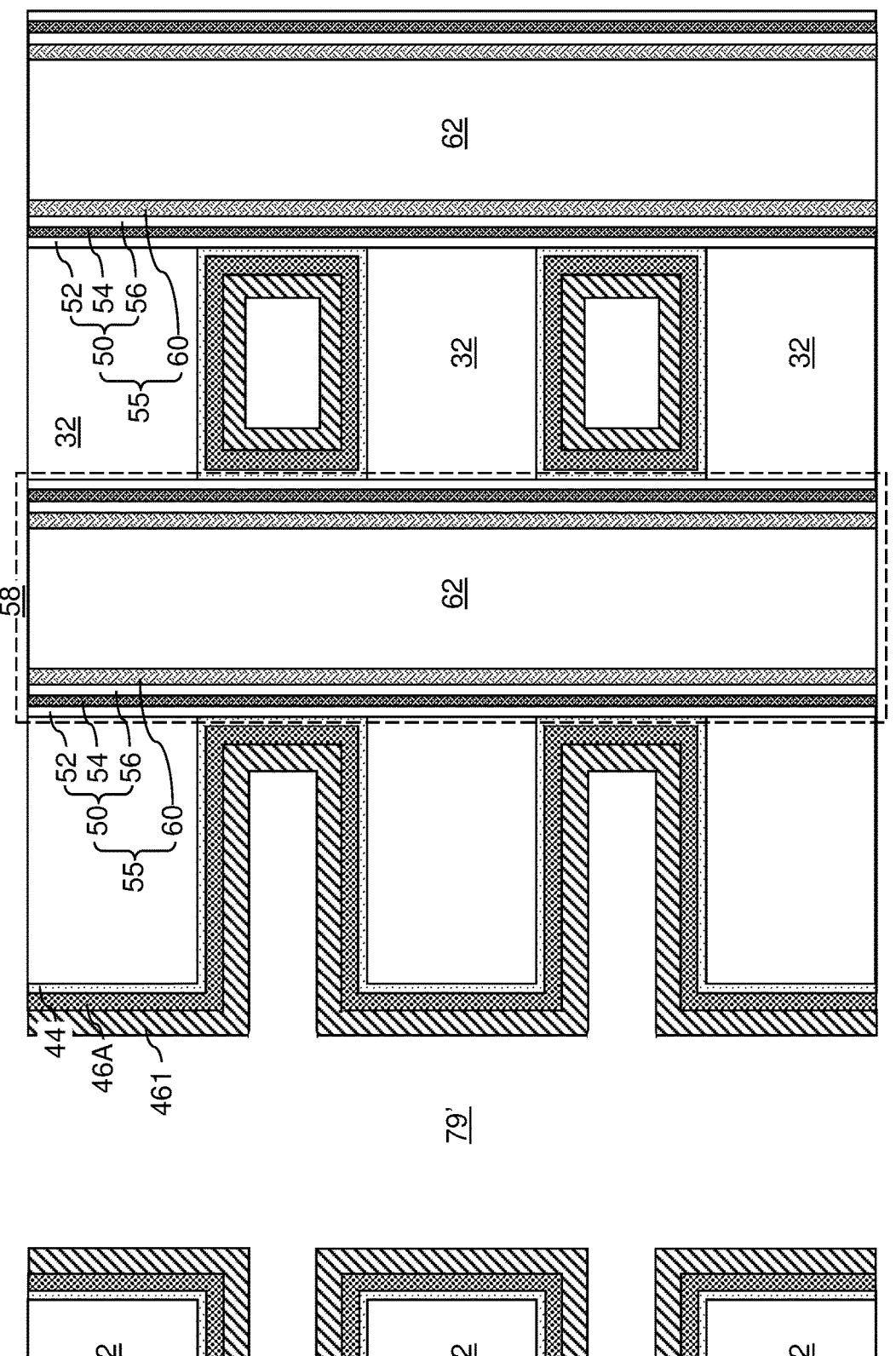

Referring to FIG. 9E, a first tungsten layer 461 can be deposited on the conductive metallic barrier liner 46A in second volumes of the lateral recesses 43 employing a first tungsten deposition process. According to an aspect of the present disclosure, a fluorine-containing tungsten precursor gas is employed as a reactant in the first tungsten deposition process, such as a CVD or ALD process. For example, tungsten hexafluoride ($WF_6$) is employed as the reactant in the first tungsten deposition process. The thickness of the first tungsten layer 461 is in a range from 10 nm to 20 nm.

In one embodiment, a surface portion of the first tungsten layer 461 in proximity to an interface with the conductive metallic barrier liner 46A (if present) or with the blocking dielectric (e.g., outer blocking dielectric 44 if present or otherwise the inner blocking dielectric 52) if the barrier liner 46 is omitted, comprises boron or silicon at a peak atomic concentration in a range from 1 part per million to 10,000 parts per million. Thus, the non-metal nucleation layer 46N is incorporated into the first tungsten layer 461. An unfilled volume is present within each of the lateral recesses 43 after formation of the first tungsten layer 461.

While a deposition process employing a fluorine-free precursor gas can provide a tungsten layer that is free of fluorine, it has been observed that such a tungsten layer has a smaller average grain size (on the order of 1 nm-2 nm) than the average grain size (on the order of 3 nm-10 nm) in a tungsten layer formed employing a fluorine-containing precursor gas, such as tungsten hexafluoride. Thus, the first tungsten layer 461 can provide lower electrical resistivity than a tungsten layer of a same thickness that is formed employing a fluorine-free tungsten precursor gas.

Due to the use of a fluorine-containing precursor gas (such as tungsten hexafluoride) during the deposition process that forms the first tungsten layer 461, the first tungsten layer 461 comprises fluorine atoms at an average atomic concentration in a range from $1 \times 10^{21}/cm^3$ to $5 \times 10^{21}/cm^3$.

In one embodiment, an air break process may be optionally performed to physically expose the outer surfaces of the first tungsten layer 461 to an ambient having a total pressure of about 1 atmospheric pressure. The ambient may comprise air or another oxygen containing ambient. The air break process oxidizes the exposed surface of the first tungsten layer 461 to form tungsten oxide and/or tungsten oxyfluoride (e.g., $WO_2F_2$ or the like). An inert ambient anneal process may be optionally performed to remove tungsten oxide and/or tungsten oxyfluoride from the surface of the first tungsten layer 461 and/or to remove fluorine from the third volume of the recesses 43 via the lateral isolation trenches 79. For example, the exemplary structure can be placed in an argon-containing ambient or another inert ambient, and annealed to remove fluorine atoms either in gaseous form or in the form of a fluorine-containing volatile compound, such as $WO_2F_2$. The elevated temperature of the argon anneal process may be in a range from 350 degrees Celsius to 500 degrees Celsius.

Figure 9F:
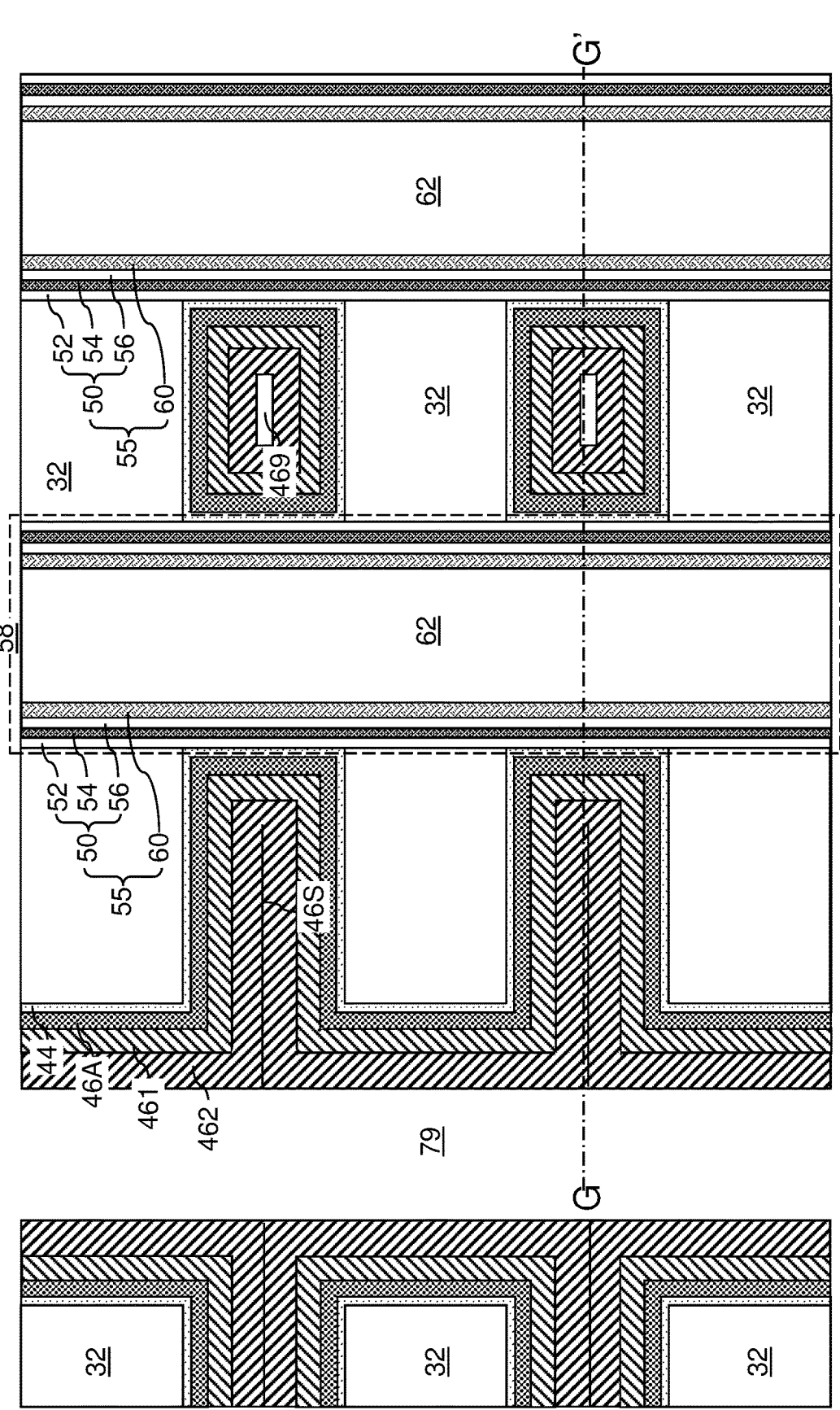
Figure 9G:
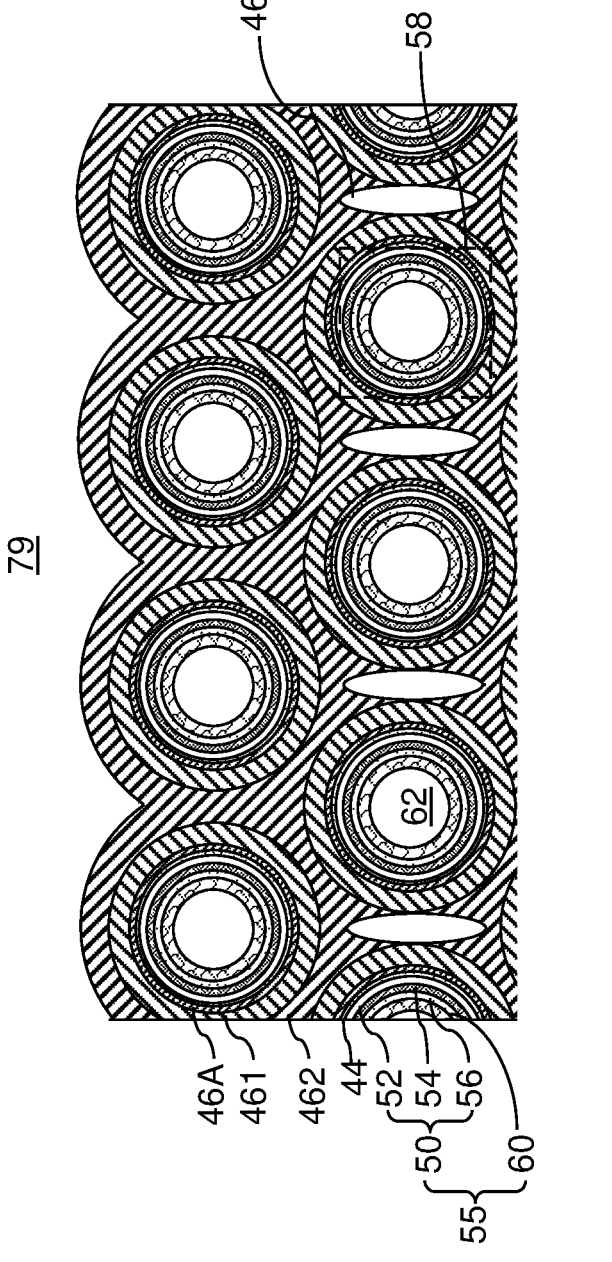
FIG. 9G is a horizontal cross-sectional view of the exemplary structure along the horizontal plane G-G' of FIG. 9F.

Referring to FIGS. 9F and 9G, a second tungsten layer 462 can be deposited on the first tungsten layer 461 in third volumes of the lateral recesses 43 employing a second tungsten deposition process. The thickness of the second tungsten layer 462 is in a range from 5 nm to 10 nm.

According to an aspect of the present disclosure, a fluorine-free tungsten precursor gas is employed as a reactant in the second tungsten deposition process. For example, tungsten pentachloride ($WCl_5$), tungsten dichloride dioxide ($WO_2Cl_2$) (also known as tungstyl chloride), or tungsten (VI) oxytetrachloride ($WOCl_4$) can be employed as the reactant in the second tungsten deposition process. In one embodiment, the second tungsten deposition process comprises at ALD process including multiple repetitions of a unit processing sequence. The unit processing sequence comprises (1) a reactant soak step in which the fluorine-free tungsten precursor gas (such as $WCl_5$, $WO_2Cl_2$ or $WOCl_4$) and a purge gas (such as nitrogen gas) are concurrently provided into the lateral recesses 43, (2) a first purge step, (3) a reduction step in which hydrogen is provided into the lateral recesses 43, and (4) a second purge step. In one embodiment, the purge gas (such as nitrogen gas) can be flowed into the process chamber throughout the four steps of the unit processing sequence, and the first and second purse steps comprise nitrogen purge steps. Thus, the purge gas may be the only gas that is flowed into the process chamber during the first purge step and the second purge step. In one embodiment, hydrogen gas and the purge gas can be concurrently flowed into the process chamber during the reduction step. The second tungsten deposition process may be conducted at a temperature of 375 degrees Celsius to 500 degrees Celsius.

The duration of the second tungsten deposition process can be selected such that the second tungsten layer 462 encloses a plurality of encapsulated cavities (i.e., air gaps) 469 that are free of any solid-phase material within a volume of a subset of lateral recesses 43 located distal from respective lateral isolation trenches 79 (e.g., in a middle portion of a space between a neighboring pair of respective lateral isolation trenches 79). Generally, the gaps between neighboring pairs of memory opening fill structures 58 that are located adjacent to a lateral isolation trench 79 can be filled with the second tungsten layer 462 to form a seam 46S between two growth surfaces of the second tungsten layer 462. Unfilled remaining volumes of the lateral recesses 46 that are laterally surrounded by a respective set of neighboring memory opening fill structures 58 located distal from respective lateral isolation trenches 79 constitute the encapsulated cavities 469. Each of the plurality of encapsulated cavities 469 may be laterally surrounded by a respective subset of the memory opening fill structures 58.

Generally, each seam 46S at which two surfaces of the second tungsten layer 462 contact each other can be connected to at least one encapsulated cavity 469 upon formation of the encapsulated cavities 469. Each of the encapsulated cavities 469 may be enclosed by the second tungsten layer 462, and can be free of any solid-phase material. Each of the encapsulated cavities 469 may be laterally surrounded by a respective subset of the memory opening fill structures 58, which may be a set of two adjacent memory opening fill structures 58. In one embodiment, all surfaces of each seam 46S may be surfaces of the second tungsten layer 462.

In one embodiment, the second tungsten layer 462 is free of silicon atoms, or comprises residual silicon atoms (due to diffusion through the first tungsten layer 461) at an average atomic concentration less than 1 part per million, such as less than 0.1 part per million and/or less than 0.01 part per million. In one embodiment, the second tungsten layer 462 is free of boron atoms, or comprises residual boron atoms (due to diffusion through the first tungsten layer 461) at an average atomic concentration less than 1 part per million, such as less than 0.1 part per million and/or less than 0.01 part per million.

Due to the use of a fluorine-free precursor gas (such as tungsten hexafluoride) during the deposition process that forms the second tungsten layer 462, the second tungsten layer 462 comprises fluorine atoms at an average atomic concentration that is lower than the average fluorine atomic concentration in the first tungsten layer 461. In this case, all fluorine atoms that are present in the second tungsten layer 462 may be due to diffusion of fluorine atoms from the first tungsten layer 461 into the second tungsten layer 462. In one embodiment, the second tungsten layer 462 may comprise fluorine atoms at an average atomic concentration below $2\times10^{21}/cm^3$ in a range from $1\times10^{19}/cm^3$ to $1\times10^{21}/cm^3$, such as from $5\times10^{19}/cm^3$ to $5\times10^{20}/cm^3$.

The average grain size in the second tungsten layer 462 is determined predominantly by the average grain size in the underlying tungsten layer, i.e., the average grain size in the first tungsten layer 461. Thus, the average grain size of the second tungsten layer 462 can be relatively large despite use of a fluorine-free precursor gas during the second tungsten deposition process. In other words, use of the fluorine-free tungsten precursor gas during the second tungsten deposition process does not incur a significant decrease in the average grain size in the second tungsten layer 462. Thus, it is possible to maintain the average grain size in the second tungsten layer 462 at about the same value (e.g., within 10%) as the average grain size in the first tungsten layer 461, while decreasing the average fluorine atomic concentration in the second tungsten layer 462.

Figure 9H:
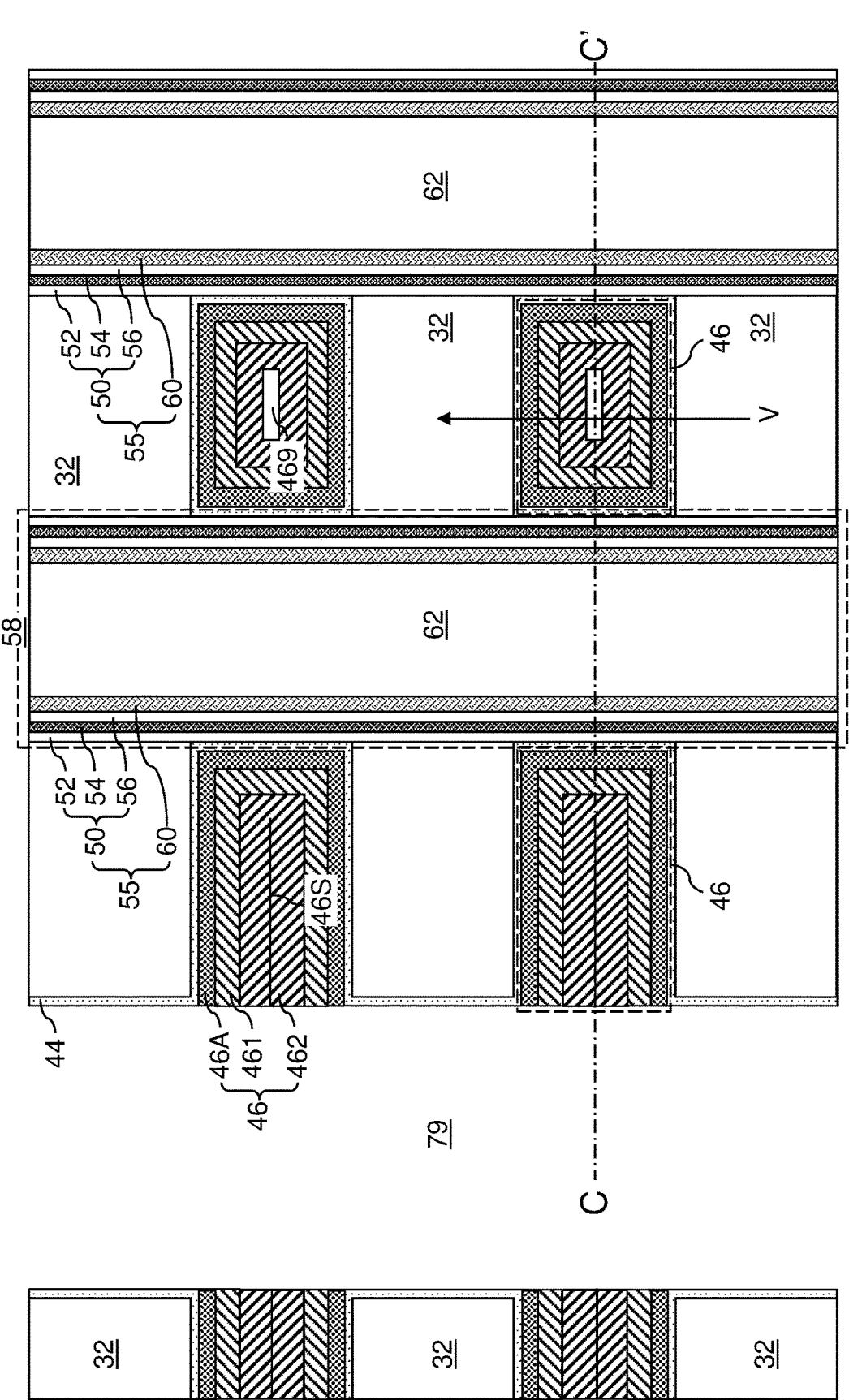

Referring to FIG. 9H, an etch back process can be performed to remove portions of the second tungsten layer 462, the first tungsten layer 461, and the conductive metallic barrier liner 46A that are located in the lateral isolation trenches 79 or above the contact-level dielectric layer 80. The etch back process may comprise an isotropic etch process and/or an anisotropic etch process, and removes portions of the t the second tungsten layer 462, the first tungsten layer 461, and the conductive metallic barrier liner 46A that are located outside the volumes of the lateral recesses 43. The etch back process may be selective to the outer blocking dielectric layer 44. Each remaining portion of the second tungsten layer 462, the first tungsten layer 461, and the conductive metallic barrier liner 46A that fills a lateral recess 43 constitutes an electrically conductive layer 46. An outer sidewall of each electrically conductive layer 46 may be vertically coincident with a sidewall of the outer blocking dielectric layer 44. Alternatively, in case vertically-extending portions of the outer blocking dielectric layer 44 are removed from around the lateral isolation trenches 79 or layer 44 is omitted entirely, then an outer sidewall of each electrically conductive layer 46 may be vertically coincident with a sidewall of a lateral isolation trench 79.

An alternating stack (32, 46) of insulating layers 32 and electrically conductive layers 46 can be formed. Each of the electrically conductive layers 46 may comprises a conductive metallic barrier liner 46A, a first tungsten layer 461 in contact with the conductive metallic barrier liner 46A and containing fluorine at a first average fluorine atomic concentration, and a second tungsten layer 462 in contact with the first tungsten layer 461 and containing fluorine at a second average fluorine atomic concentration that is less than 50% of the first average fluorine atomic concentration. In one embodiment, two horizontal surfaces of the second tungsten layer 462 may contact each other at the horizontally-extending seam segment (i.e., a horizontally-extending portion of a seam 46S) of a respective electrically conductive layer 46.

Figure 10:
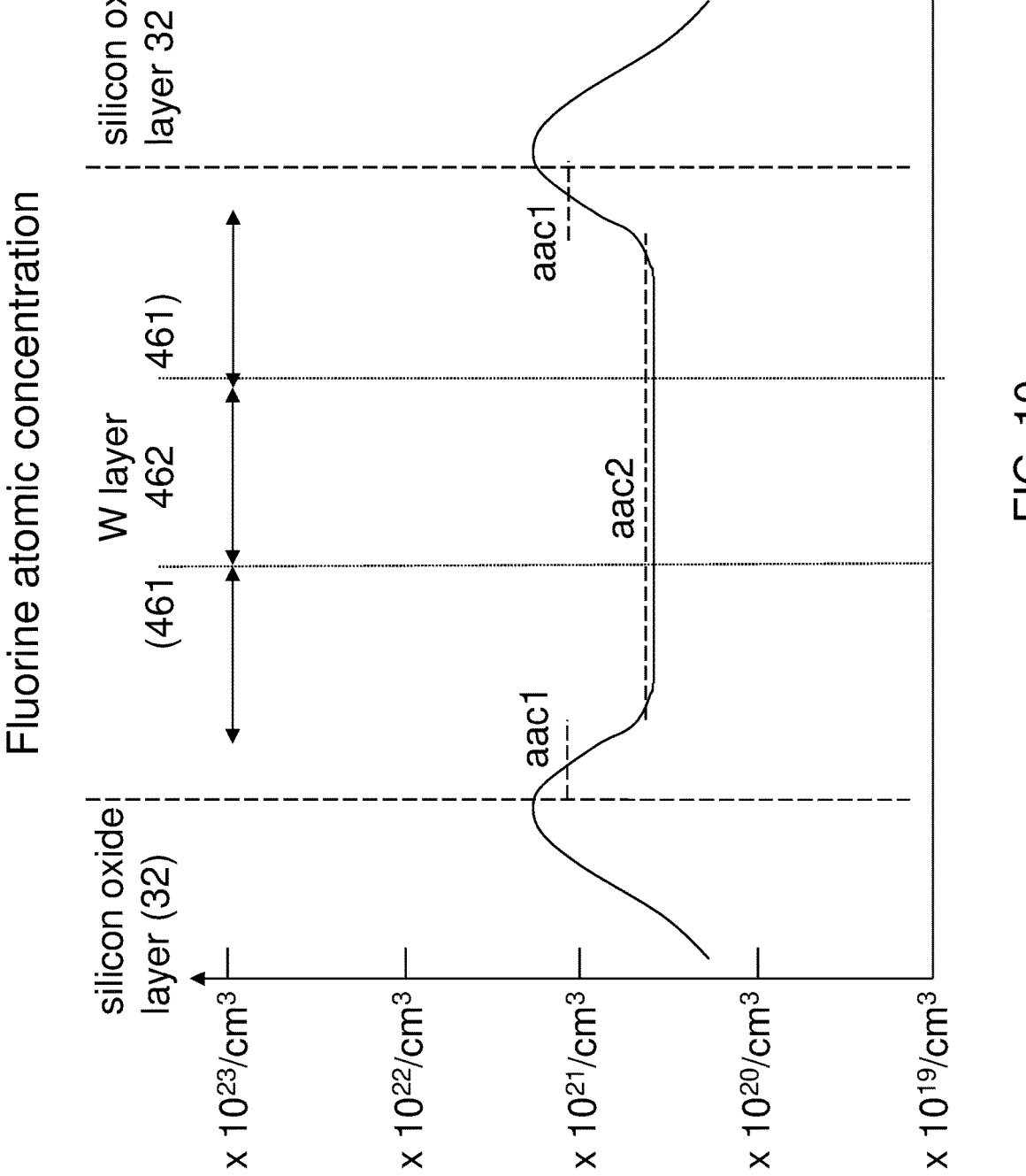
FIG. 10 is a profile of an atomic concentration of an embodiment example of FIG. 9H.

FIG. 10 is a profile of an atomic concentration of fluorine along the vertical line V of the embodiment example of FIG. 9H. The regions having the first average fluorine atomic concentration aac1 of about 1 to $3\times10^{21}/cm^3$ correspond to the regions of the upper and lower boundaries of the first tungsten layer 461 with the conductive metallic barrier liner 46A (if present) or the blocking dielectric layer (44 or 52) (if liner 46A is absent). The region having the second average fluorine atomic concentration aac2 of about 4 to $8\times10^{20}/cm^3$ corresponds to the region of the second tungsten layer 462. The electrically conductive layers 46 including the TiN liner 46A and the composite tungsten layer (461, 462) may have a resistivity less than 40 microOhm-cm, such as between 30 and 39 microOhm-cm for thicknesses between 10 and 20 nm.

Figure 11:
FIG. 11 is a profile of an atomic concentration of fluorine of a comparative example.

FIG. 11 is a profile of an atomic concentration of fluorine along the vertical line V of a comparative example in which the second tungsten layer 462 is omitted and the entire tungsten portion of the electrically conductive layers 46 consists of the first tungsten layer 461 deposited using tungsten hexafluoride. The regions having the first average fluorine atomic concentration aac1 of about 1 to $4\times10^{21}/cm^3$ correspond to the regions of the upper and lower boundaries of the first tungsten layer 461 with the conductive metallic barrier liner 46A (if present) or the blocking dielectric layer (44 or 52) (if liner 46A is absent). The region having the third average fluorine atomic concentration aac3 of about $8\times10^{20}/cm^3$ to $1\times10^{21}/cm^3$ corresponds to the middle portion of the first tungsten layer 461, when viewed in the vertical direction. The high fluorine atomic concentration acc3 of about $8\times10^{20}/cm^3$ to $1\times10^{21}/cm^3$ at middle portion of the first tungsten layer 461 is believed to be caused by the accumulation of fluorine in the encapsulated cavities 469. The region having the second average fluorine atomic concentration aac2 of about 4 to $8\times10^{20}/cm^3$ corresponds to the portion of the first tungsten layer 461 between its middle portion and its upper and lower boundary portions. Thus, the comparative example of FIG. 11 includes a higher fluorine concentration in the middle of the electrically conductive layer 46 than the embodiment example of FIG. 10. In general, at least a 50% reduction in fluorine and/or fluorine compound concentration in the memory device is provided by the embodiment example relative to the comparative example. The electrically conductive layers 46 including the TiN liner 46A and the fluorine containing tungsten layer 461 may also have a resistivity less than 40 microOhm-cm, such as between 20 and 39 microOhm-cm for thicknesses between 10 and 25 nm. Thus, the resistivity of the electrically conductive layer of the embodiment example is similar to that of the comparative example.

Figure 12:
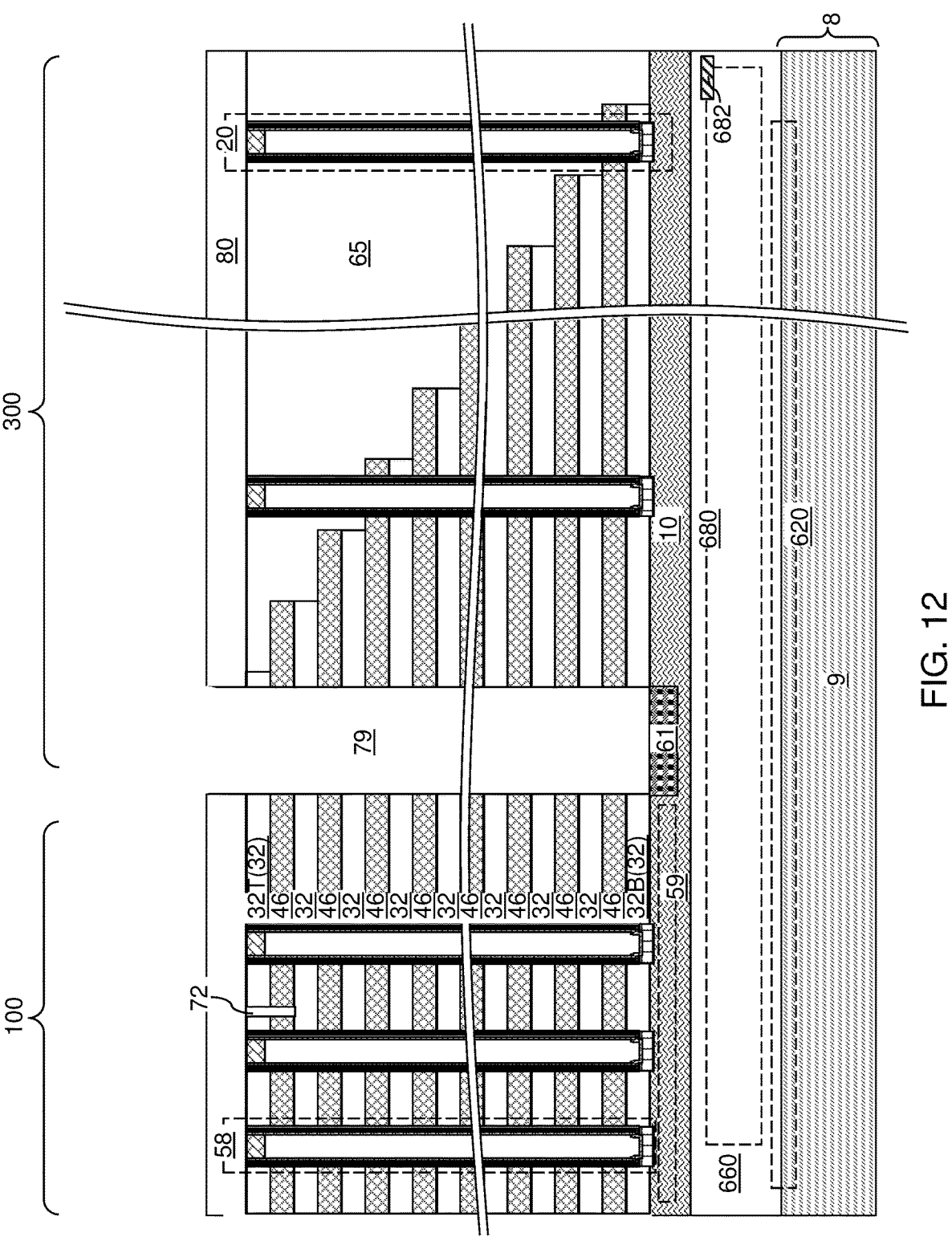
FIG. 12 is a schematic vertical cross-sectional view of the exemplary structure after formation of the electrically conductive layers according to an embodiment of the present disclosure.

Referring to FIG. 12, the first exemplary structure is illustrated after formation of the electrically conductive layers 46 at the processing step of FIG. 9H. The outer blocking dielectric layer 44 is not expressly illustrated for clarity.

Figure 13A:
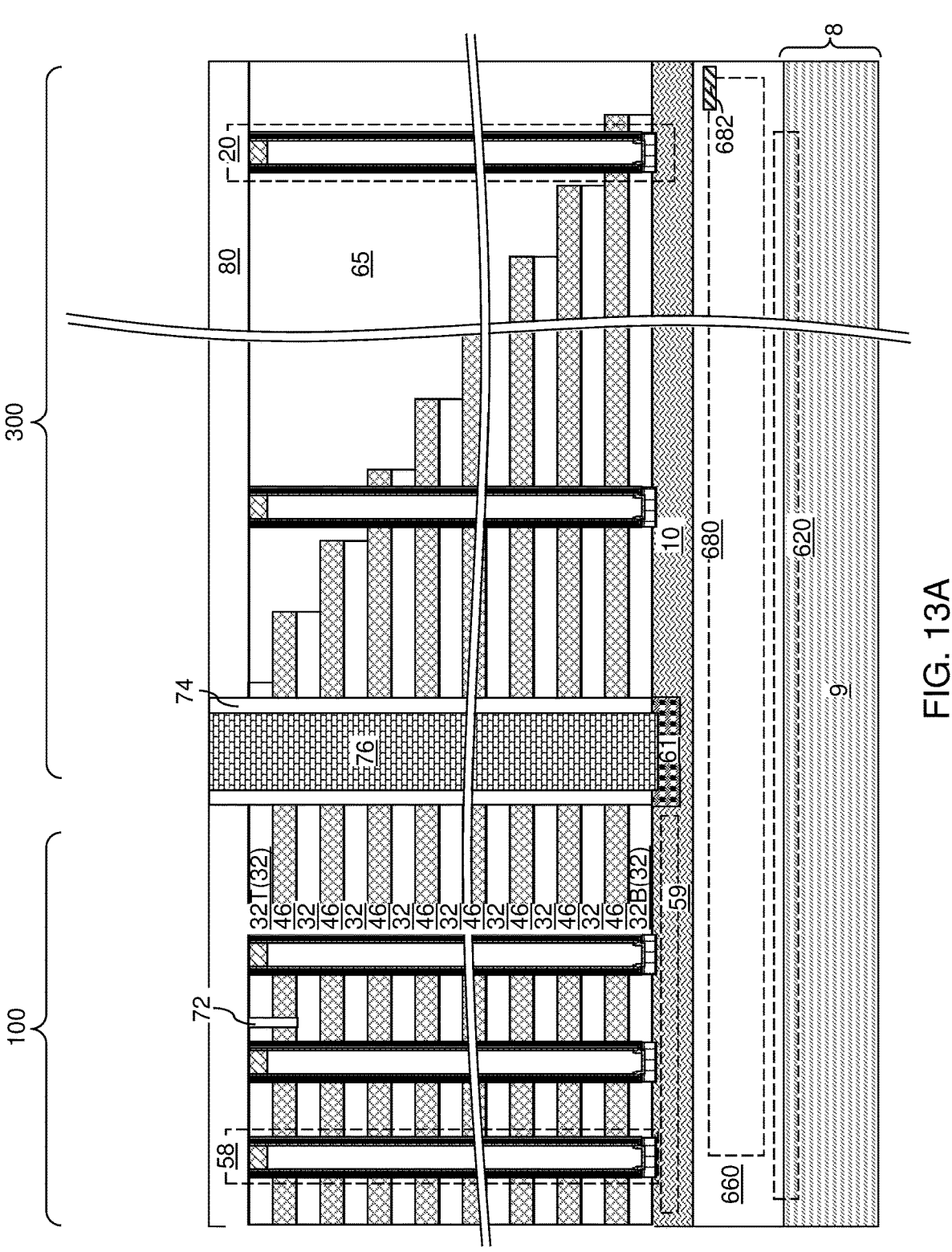
FIG. 13A is a schematic vertical cross-sectional view of the exemplary structure after formation of lateral isolation trench fill structures according to an embodiment of the present disclosure.
Figure 13B:
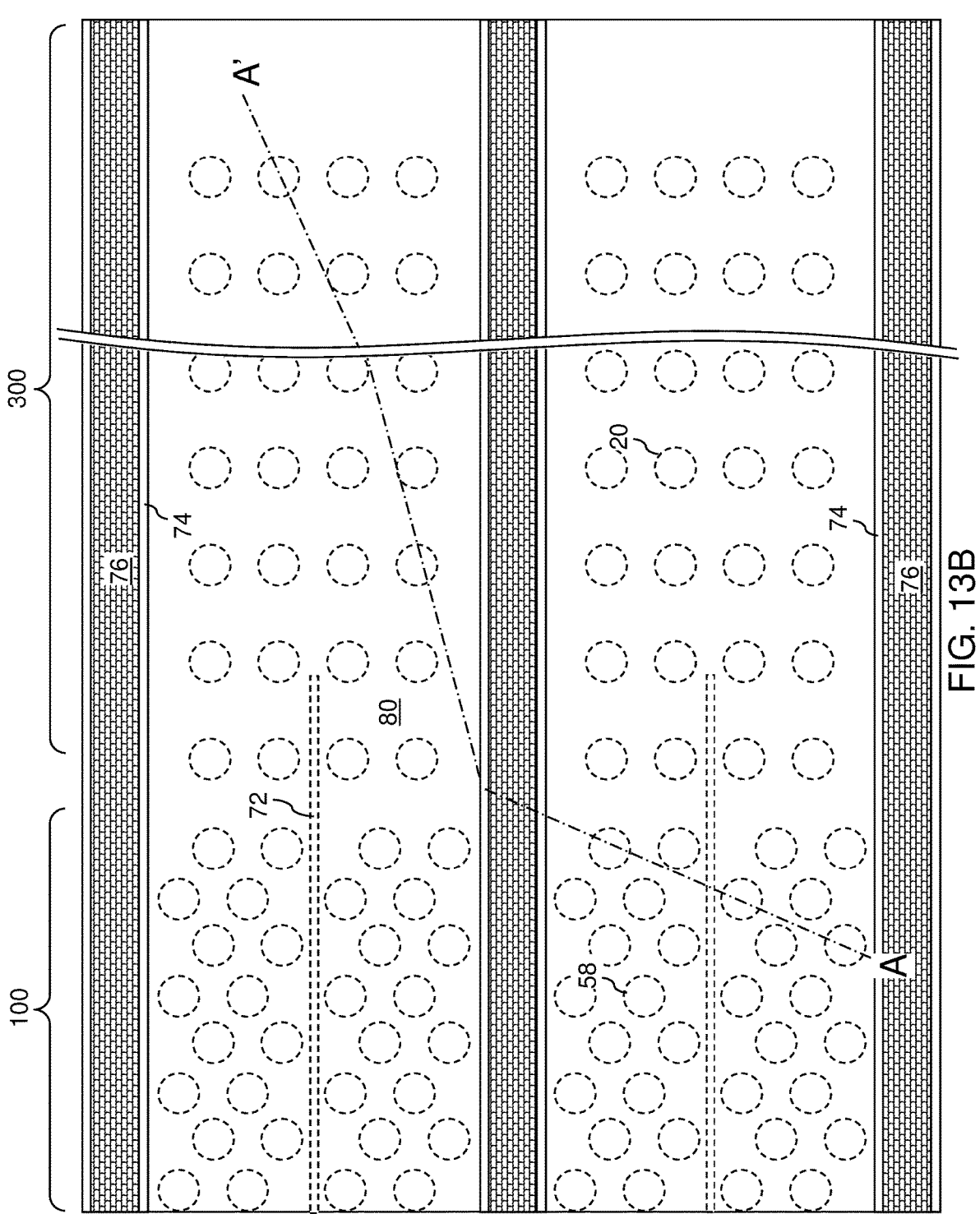
FIG. 13B is a top-down view of the exemplary structure of FIG. 13A. The vertical plane A-A' is the plane of the schematic vertical cross-sectional view of FIG. 13A.

Referring to FIGS. 13A and 13B, an insulating material layer can be formed in the lateral isolation trenches 79 and over the contact-level dielectric layer 80 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 80 and at the bottom of each lateral isolation trench 79. Each remaining portion of the insulating material layer constitutes an insulating spacer 74. A lateral isolation cavity is present within a volume surrounded by each insulating spacer 74.

A top surface of a source region 61 can be physically exposed at the bottom of each lateral isolation trench 79. Each source region 61 is formed in an upper portion of the semiconductor material layer 10. Semiconductor channels (59, 11, 60) extend between each source region 61 and a respective set of drain regions 63. The semiconductor channels (59, 11, 60) include the vertical semiconductor channels 60 of the memory stack structures 55.

A source contact via structure 76 can be formed within each lateral isolation cavity. Each contact via structure 76 can fill a respective lateral isolation cavity. The source contact via structures 76 can be formed by depositing at least one conductive material in the remaining unfilled volume (i.e., the lateral isolation cavity) of the lateral isolation trench 79. For example, the at least one conductive material can include a conductive liner (not expressly shown) and a conductive fill material portion (not expressly shown). The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact-level dielectric layer 80 overlying the alternating stack (32, 46) as a stopping layer. If chemical mechanical planarization (CMP) process is employed, the contact-level dielectric layer 80 can be employed as a CMP stopping layer. Each remaining continuous portion of the at least one conductive material in the lateral isolation trenches 79 constitutes a source contact via structure 76. Each source contact via structure 76 extends through the alternating stacks (32, 46), and contacts a top surface of a respective source region 61. Generally, a source contact via structure 76 can be formed within each of the lateral isolation trenches 79 after formation of the insulating spacers 74 by depositing and planarizing at least one conductive material in volumes of the lateral isolation trenches 79 that are not filled with the insulating spacers 74. Each contiguous combination of an insulating spacer 74 and a source contact via structures 76 fills a respective lateral isolation trench 79, and is herein referred to as a lateral isolation trench fill structure (74, 76).

Alternatively, the above described insulating material layer can be formed in the lateral isolation trenches 79 to completely fill the entire volume of a lateral isolation trench 79 and may consist essentially of at least one dielectric material. In this alternative embodiment, the source region 61 and the lateral isolation trench via structure 76 may be omitted, and each lateral isolation trench fill structure may consist of at least one insulating material portion.

Generally, each lateral isolation trench fill structure (74, 76) vertically extending from a bottommost layer of the alternating stack (32, 46) to a topmost layer of the alternating stack (32, 46) and comprising a dielectric sidewall surface that is adjoined to the horizontally-extending seam segment of the seam 46S of the electrically conductive layer 46. In one embodiment, a dielectric sidewall surface of a lateral isolation trench fill structure (74, 76) contacts each electrically conductive layer 46 within an alternating stack (32, 46).

Figure 14A:
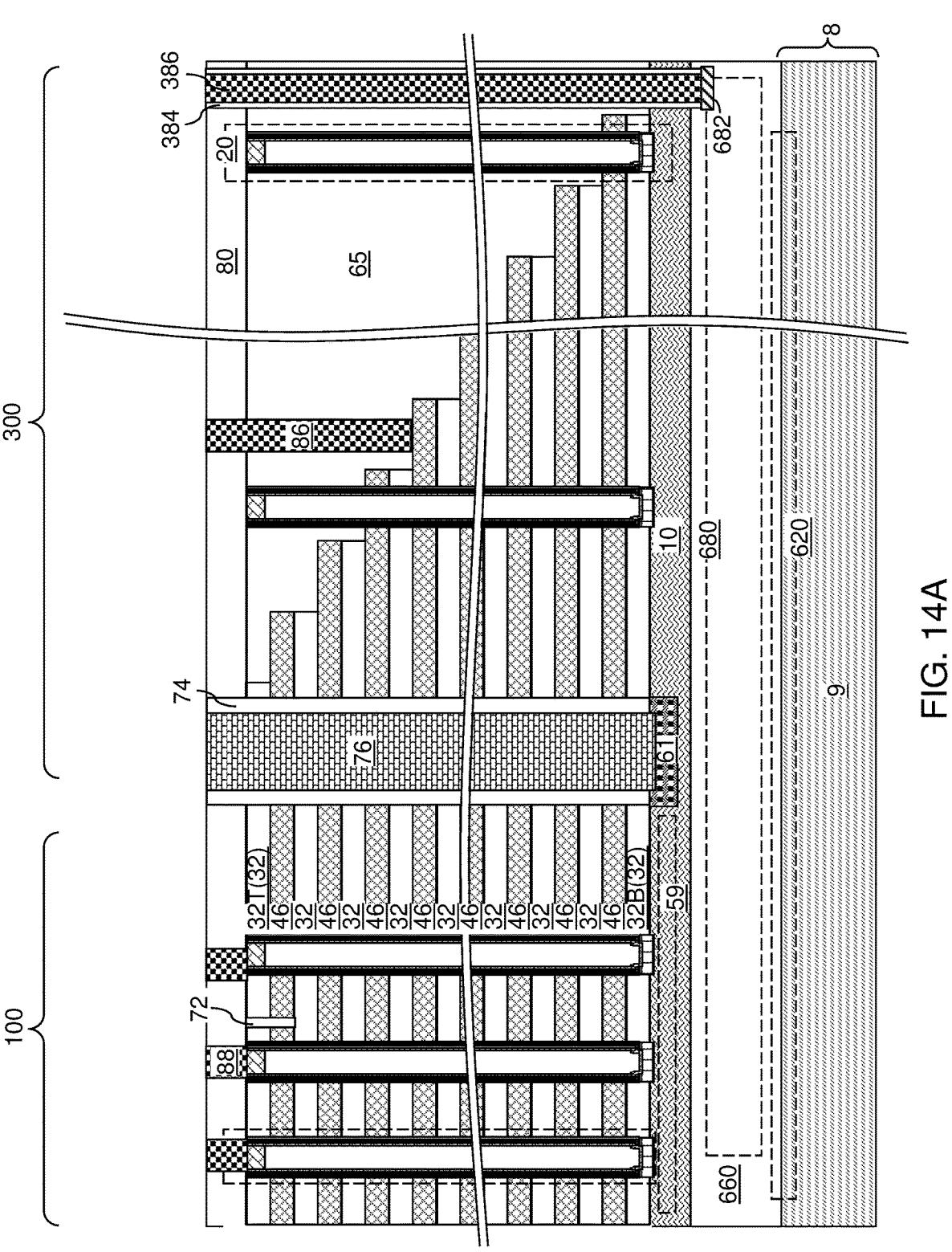
FIG. 14A is a schematic vertical cross-sectional view of the exemplary structure after formation of additional contact via structures according to an embodiment of the present disclosure.
Figure 14B:
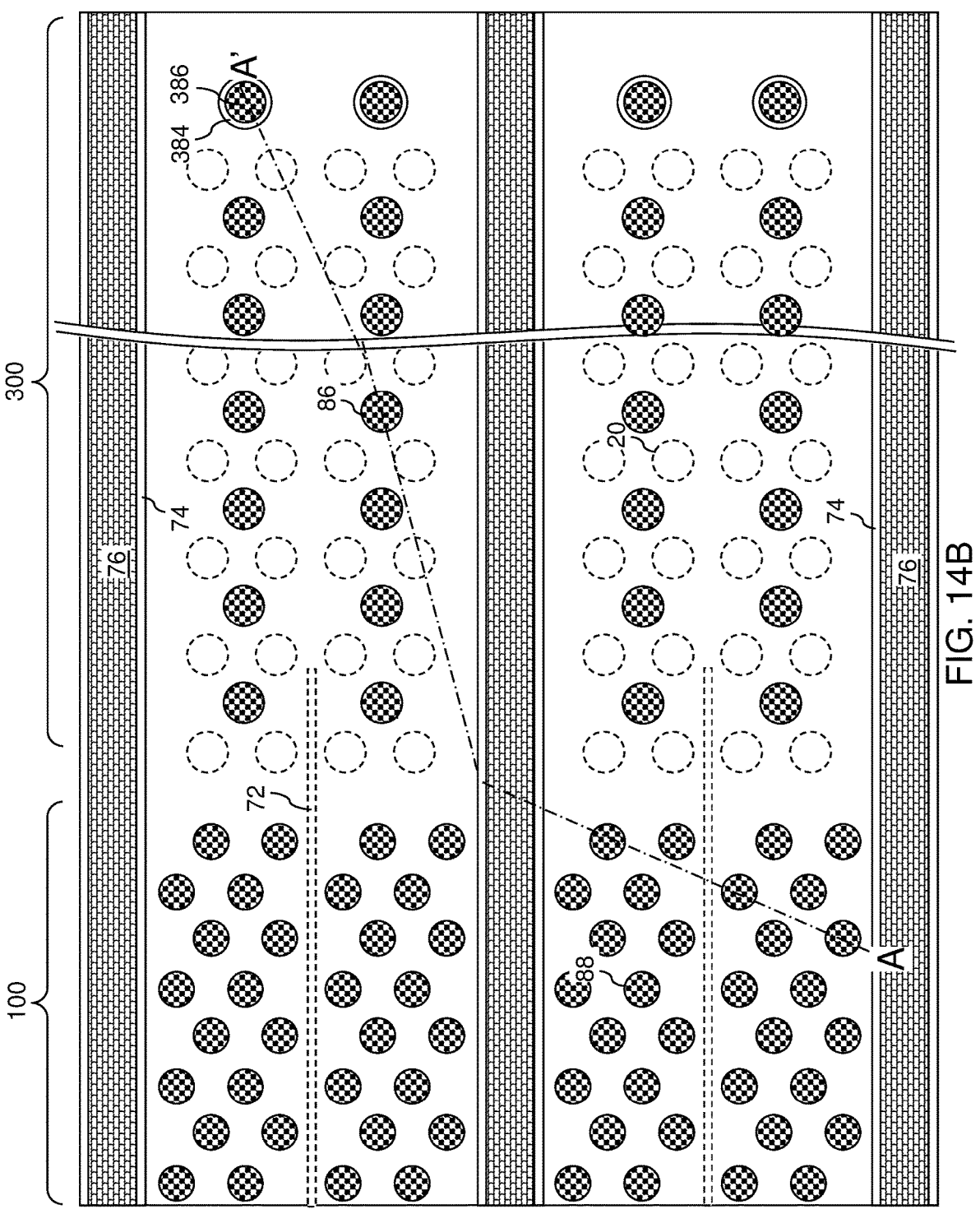
FIG. 14B is a top-down view of the exemplary structure of FIG. 14A. The vertical plane A-A' is the plane of the schematic vertical cross-sectional view of FIG. 14A.
Figure 14C:
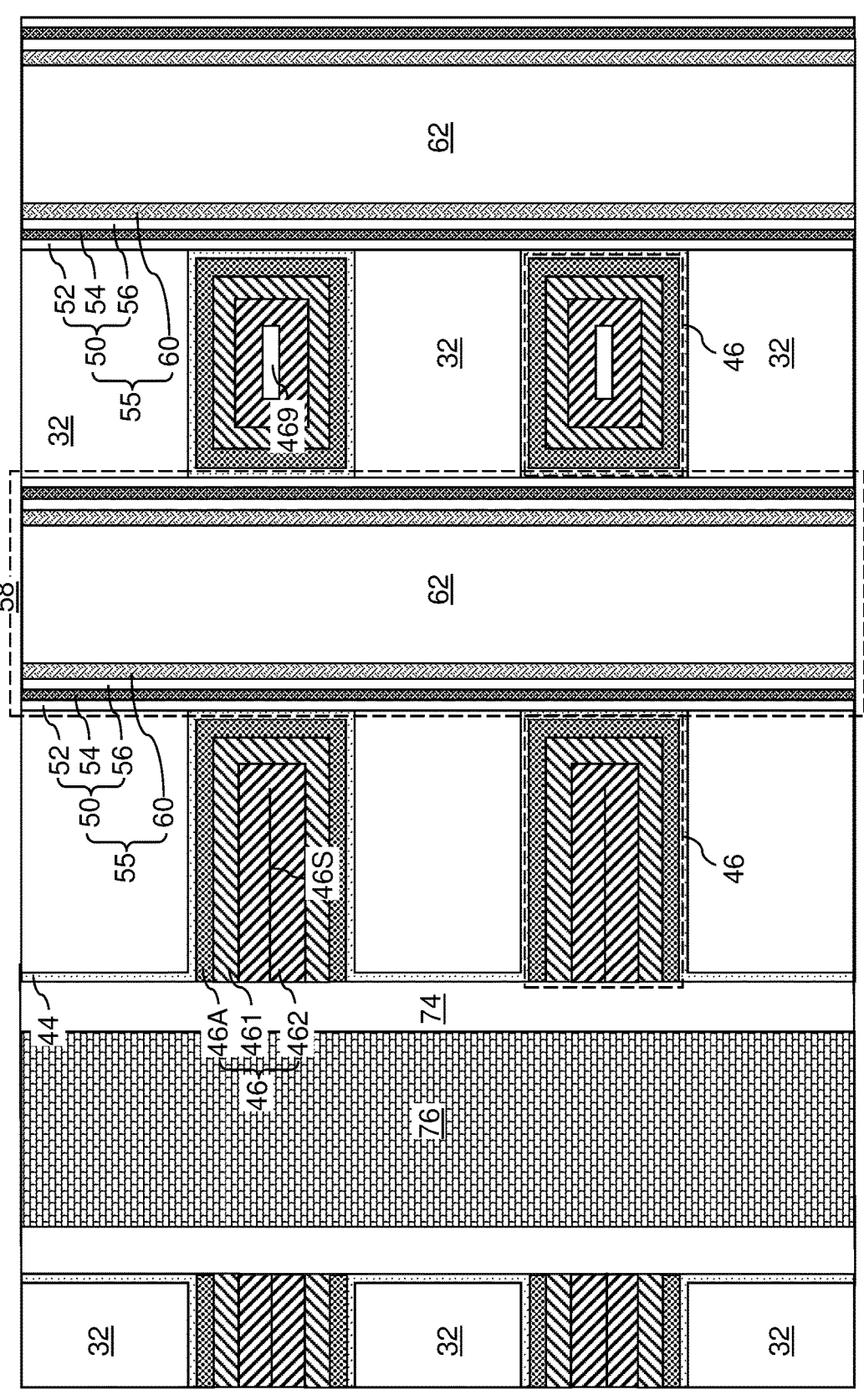
FIG. 14C is a magnified vertical cross-sectional view of a region of the exemplary structure of FIGS. 14A and 14B.

Referring to FIGS. 14A-14C, additional contact via structures (88, 86, 386) can be formed through the contact-level dielectric layer 80, and optionally through the retro-stepped dielectric material portion 65.

For example, drain contact via structures 88 can be formed through the contact-level dielectric layer 80 on each drain region 63. Layer contact via structures 86 can be formed on the electrically conductive layers 46 through the contact-level dielectric layer 80, and through the retro-stepped dielectric material portion 65. Optional through-memory-level connection via structures 386 can be formed through the retro-stepped dielectric material portion 65 and through the semiconductor material layer 10 directly on a respective metal pad 682. An insulating spacer 384 may be formed around each through-memory-level connection via structure 386 to electrically isolate the through-memory-level connection via structures 386 from the semiconductor material layer 10. Bit lines (not shown) are then formed in electrical contact with the drain contact via structures 88.

Referring to all drawings and according to various embodiments of the present disclosure, a memory device comprises an alternating stack of insulating layers 32 and electrically conductive layers 46, wherein each of the electrically conductive layers 46 comprises an outer first tungsten layer 461 containing fluorine at a first average fluorine atomic concentration, and an inner second tungsten layer 462 embedded in the first tungsten layer and containing fluorine at a second average fluorine atomic concentration that is less than 50% of the first average fluorine atomic concentration; memory openings 49 vertically extending through the alternating stack (32, 46); and memory opening fill structures 58 located in the memory openings 49 and comprising a respective vertical stack of memory elements (e.g., portions of the memory film 50) and a respective vertical semiconductor channel 60.

In one embodiment, each of the electrically conductive layers 46 further comprises a conductive metallic barrier liner 46A, and the first tungsten layer 461 is in contact with the conductive metallic barrier liner 46A. In one embodiment, a surface portion of the first tungsten layer 461 in proximity to an interface with the conductive metallic barrier liner 46A comprises an element selected from boron and silicon at a peak atomic concentration in a range from 1 part per million to 10,000 parts per million; and the second tungsten layer 462 is free of boron and silicon atoms or comprises boron or silicon atoms at an average atomic concentration less than 1 part per million.

In one embodiment, the first tungsten layer 461 contains a peak fluorine concentration of at least $1 \times 10^{21}$ cm$^{-3}$ in an outer portion located in proximity to an interface with the conductive metallic barrier liner 46A, and a flat fluorine concentration below $1\times10^{21}$ cm$^{-3}$ in an inner portion located in proximity to an interface with the second tungsten layer 462; and the second tungsten layer has the flat fluorine concentration below $1\times10^{21}$ cm$^{-3}$.

In one embodiment, the second tungsten layer 462 comprises a horizontally extending seam 46S. In one embodiment, a lateral isolation trench fill structure (74, 76) vertically extends from a bottommost layer of the alternating stack to a topmost layer of the alternating stack and comprises a dielectric sidewall surface that is adjoined to the horizontally extending seam 46S. In one embodiment, the dielectric sidewall surface of the lateral isolation trench fill structure contacts each electrically conductive layer 46 within the alternating stack (32, 46). In one embodiment, the second tungsten layer 462 encloses an encapsulated cavity 469 that is free of any solid-phase material and is laterally surrounded by a subset of the memory opening fill structures 58.

In one embodiment, the first average fluorine concentration is at least $1\times10^{21}$ cm$^{-3}$; and the second average fluorine concentration is below $1\times10$ cm. For example, the first average fluorine concentration is between 1 and $5\times10^{21}$ cm$^{-3}$; and the second average fluorine concentration is between 4 and $8\times10^{20}$ cm$^{-3}$.

The various embodiments of the present disclosure provide composite tungsten layers having a large average grain size that is comparable to the average grain size of a comparative exemplary tungsten layer formed employing only fluorine-containing tungsten precursor gas, while providing a reduced average atomic fluorine concentration in the tungsten layers compared with the comparative exemplary tungsten layer. Thus, the various embodiments of the present disclosure provide tungsten layers containing less fluorine than tungsten layers formed entirely using tungsten hexafluoride while having comparative resistivity (e.g., within 25% of each other). Furthermore, due to the higher cost of the fluorine free tungsten precursors and lower grain size obtained by using such precursors to deposit a tungsten layer, the various embodiments of the present disclosure provide composite tungsten layers having a lower resistivity (e.g., at least 30% lower) than tungsten layers formed entirely using the fluorine free tungsten precursors.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a memory device, comprising:
  forming an alternating stack of insulating layers and sacrificial material layers over a substrate;

forming memory openings through the alternating stack;
  forming memory opening fill structures in the memory openings, wherein each of the memory opening fill structures comprises a respective vertical stack of memory elements and a respective vertical semiconductor channel;
  forming a lateral isolation trench through the alternating stack;
  forming lateral recesses by removing the sacrificial material layers selective to the insulating layers and the memory opening fill structures;
  depositing a first tungsten layer in the lateral recesses using a first tungsten deposition process in which a fluorine-containing tungsten precursor gas is used as a reactant; and
  depositing a second tungsten layer on the first tungsten layer in the lateral recesses using a second tungsten deposition process in which a fluorine-free tungsten precursor gas is used as a reactant.

2. The method of claim 1, further comprising depositing a conductive metallic barrier liner in the lateral recesses prior to the depositing the first tungsten layer in the lateral recesses, wherein the first tungsten layer is deposited on the conductive metallic barrier liner located in the lateral recesses.

3. The method of claim 1, wherein the first tungsten deposition process comprises tungsten deposition using tungsten hexafluoride as the reactant.

4. The method of claim 1, wherein:
  the second tungsten deposition process comprises multiple repetitions of a unit processing sequence; and
  the unit processing sequence comprises a reactant soak step in which the fluorine-free tungsten precursor gas is provided into the lateral recesses, a first purge step, a reduction step in which a reducing gas is provided into the lateral recesses, and a second purge step.

5. The method of claim 4, wherein:
  the fluorine-free tungsten precursor gas comprises WCl$_5$, WO$_2$Cl$_2$ or WOCl$_4$; and
  the reducing gas comprises hydrogen.

6. The method of claim 5, wherein nitrogen purge gas is provided into the lateral recesses during the first and the second purge steps.

7. The method of claim 1, further comprising prior to the depositing the second tungsten layer, exposing an outer surface of the first tungsten layer to an oxygen containing ambient to oxidize the outer surface of the first tungsten layer followed by annealing the first tungsten layer in an inert ambient to remove at least one of tungsten oxide or tungsten oxyfluoride from the outer surface of the first tungsten layer.

8. The method of claim 1, wherein the second tungsten layer encloses an encapsulated cavity that is free of any solid-phase material and is laterally surrounded by a subset of the memory opening fill structures.

9. The method of claim 1, wherein the second tungsten layer contains at least 50% less fluorine than the first tungsten layer.

10. The method of claim 1, wherein a surface portion of the first tungsten layer comprises boron or silicon at a peak atomic concentration in a range from 1 part per million to 10,000 parts per million, and the second tungsten layer is free of silicon and boron atoms or comprises silicon or boron atoms at an average atomic concentration less than 1 part per million.

* * * * *